(12) United States Patent
Akiyoshi

(10) Patent No.: US 10,614,954 B2
(45) Date of Patent: Apr. 7, 2020

(54) CERAMIC ELECTRONIC COMPONENT AND MOUNTING STRUCTURE THEREFOR

(71) Applicant: Murata Manufacturing Co., Ltd., Nagaokakyo-shi, Kyoto-fu (JP)

(72) Inventor: Teppei Akiyoshi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 52 days.

(21) Appl. No.: 16/016,899

(22) Filed: Jun. 25, 2018

(65) Prior Publication Data

US 2018/0374640 A1 Dec. 27, 2018

(30) Foreign Application Priority Data

Jun. 27, 2017 (JP) ................. 2017-125649

(51) Int. Cl.
*H01G 2/06* (2006.01)
*H01G 4/232* (2006.01)
(Continued)

(52) U.S. Cl.
CPC ............... *H01G 2/06* (2013.01); *H01G 4/12* (2013.01); *H01G 4/224* (2013.01); *H01G 4/232* (2013.01); *H01G 4/30* (2013.01); *H05K 3/3426* (2013.01); *H01G 4/2325* (2013.01); *H05K 2201/10015* (2013.01); *H05K 2201/10568* (2013.01); *H05K 2201/10651* (2013.01); *H05K 2201/10772* (2013.01); *H05K 2201/10833* (2013.01)

(58) Field of Classification Search
CPC ........ H01G 4/228; H01G 4/232; H01G 4/224; H01G 2/10; H01G 2/06; H05K 3/3426
See application file for complete search history.

(56) References Cited

U.S. PATENT DOCUMENTS 3,581,167 A * 5/1971 Veater ................. H01G 2/08
361/321.2
6,288,887 B1 * 9/2001 Yoshida .............. H01G 4/232
361/306.1
(Continued)

FOREIGN PATENT DOCUMENTS

JP 08-293568 A 11/1996
JP 11-191472 A 7/1999
(Continued)

*Primary Examiner* — Eric W Thomas
(74) *Attorney, Agent, or Firm* — Keating & Bennett, LLP

(57) ABSTRACT

A ceramic electronic component includes an electronic component body and portions of first and second metal terminals covered with an outer resin material. The first metal terminal includes, connected in order, a first terminal joint portion, a first extension portion extending in a direction toward a mounting surface, and a first mount portion extending toward a side opposite to the electronic component body. The second metal terminal includes, connected in order, a second terminal joint portion, a second extension portion extending in the direction toward the mounting surface, and a second mount portion extending toward a side opposite to the electronic component body. The first and second mount portions respectively include first and second protrusions protruding toward the mounting surface. The outer resin material includes a protruding portion protruding toward the mounting surface.

18 Claims, 14 Drawing Sheets

(51) Int. Cl.
*H05K 3/34* (2006.01)
*H01G 4/224* (2006.01)
*H01G 4/30* (2006.01)
*H01G 4/12* (2006.01)

(56) References Cited

U.S. PATENT DOCUMENTS

| | | | | |
|---|---|---|---|---|
| 6,316,726 B1 * | 11/2001 | Hidaka | ................. | H01G 4/228 |
| | | | | 174/538 |
| 2008/0024960 A1 * | 1/2008 | Hidaka | ................. | H01G 2/065 |
| | | | | 361/807 |

FOREIGN PATENT DOCUMENTS

| JP | 2000-252606 A | | 9/2000 |
|---|---|---|---|
| JP | 2001-189232 A | | 7/2001 |
| JP | 2011091335 A | * | 5/2011 |
| JP | 2011096898 A | * | 5/2011 |
| JP | 2011-216420 A | | 10/2011 |

* cited by examiner

III-III SECTIONAL VIEW

IX-IX SECTIONAL VIEW

XV-XV SECTIONAL VIEW

CERAMIC ELECTRONIC COMPONENT AND MOUNTING STRUCTURE THEREFOR

CROSS REFERENCE TO RELATED APPLICATIONS

This application claims the benefit of priority to Japanese Patent Application No. 2017-125649 filed on Jun. 27, 2017. The entire contents of this application are hereby incorporated herein by reference.

BACKGROUND OF THE INVENTION

1. Field of the Invention

The present invention relates to, for example, a ceramic electronic component including a multilayer ceramic capacitor, and a mounting structure for the ceramic electronic component.

2. Description of the Related Art

A multilayer ceramic capacitor, which is a ceramic chip-type electronic component is typically used. In a case in which the multilayer ceramic capacitor is directly mounted on a mounting substrate by soldering, when the temperature changes, the mounting substrate and an electronic component body are expanded or contracted depending on their thermal expansion coefficients. However, the difference between the thermal expansion coefficients of both may cause, for example, a stress that may result in damage of the electronic component body or breakage of a joint portion.

Moreover, in a case in which the mounting substrate easily bends, such as a thin glass epoxy board, a stress may also be generated when the mounting substrate bends.

Furthermore, a stress may be generated when a force is applied to the mounting substrate and the board is deformed in a bending manner.

Such a stress applied to the multilayer ceramic capacitor may cause a crack to be generated in the multilayer ceramic capacitor. To address the problems, it has been suggested to attach a metal terminal made of a metal plate to an outer electrode of the multilayer ceramic capacitor, to keep the electronic component body in a state lifted and spaced away from the mounting substrate, and to mount the metal terminal on the mounting substrate by soldering (see Japanese Unexamined Patent Application Publication No. 2001-189232).

With such a method, the heat during the soldering is transmitted to the electronic component body via the metal terminal. A heat shock is less likely to be applied to the electronic component body. Moreover, even if a stress is generated due to a change in temperature or if the mounting substrate is deformed, the electronic component body can advantageously absorb the stress or deformation by elastic deformation of the metal terminal.

Also, welding is known as a way of mounting a connection terminal on a mount point (for example, laser welding for a method that can reduce the welding time) (see Japanese Unexamined Patent Application Publication No. 11-191472).

However, in a case in which the electronic component with the metal terminal as described in Japanese Unexamined Patent Application Publication No. 2001-189232 is mounted on the mounting substrate by soldering in a device (on-vehicle device) that is used in a high-temperature environment, the component may detach or fall from the mounting substrate due to molten solder joining the metal terminal and the mounting substrate, or the solder may be fragile because the solder is exposed to high temperatures for a long period even if the temperature is lower than the solder melting temperature. The equivalent series resistance (ESR) may be increased and the adhesion intensity may be decreased by the formation of a solder crack. A typical method of avoiding the problems may be a method of using solder having a high-temperature melting point. However, there is actually no solder that satisfies the cost, mountability, and performance requirements capable of addressing the above-described problems.

Also, a typical welding mount technology as described in Japanese Unexamined Patent Application Publication No. 11-191472 needs to press the metal to be connected against a portion at which the metal is to be welded, and connect the metal by applying current to the metal in a secure surface-contact state and thus melting the metal. If the technology is applied to the electronic component with the metal terminal as described in Japanese Unexamined Patent Application Publication No. 2001-189232, it is required to perform the connection by bringing a connection terminal member of the metal terminal to be mounted securely into surface contact with the mounting surface of the mounting substrate. The connection is time consuming.

In the case in which the laser welding as described in Japanese Unexamined Patent Application Publication No. 11-191472 is applied to the electronic component with the metal terminal as described in Japanese Unexamined Patent Application Publication No. 2001-189232, it is a precondition that the connection terminal member of the metal terminal member to be mounted is securely in surface contact with the mounting surface of the mounting substrate. At this time, it is difficult to obtain the state in which the portion subject to welding is securely in contact due to the problems of warpage of the mounting substrate and coplanarity of the electronic component (flatness of component (in the case of the metal terminals, shift between mounting surfaces of left and right metal terminals). The difficulty in the contact may result in welding defects.

Also, the metal terminal having a metallic luster reflects laser energy, so the metal terminal member cannot be efficiently welded.

Another method of laser welding the electronic component while pressing the electronic component has been conceived. However, the speed of laser welding obtained because of the non-contact state cannot be achieved.

SUMMARY OF THE INVENTION

Preferred embodiments of the present invention provide ceramic electronic components each including a metal terminal, and mounting structures for the ceramic electronic components, the electronic components being capable of being reliably welded and mounted even when a mounting substrate is warped, connection portions are not in one plane due to a step, and the electronic components have low coplanarity.

According to a preferred embodiment of the present invention, a ceramic electronic component includes an element body including a first main surface and a second main surface that are opposed to one another; an electronic component body including a first outer electrode arranged on the element body, and a second outer electrode arranged on the element body; a first metal terminal connected to the first outer electrode; a second metal terminal connected to the second outer electrode; and an outer resin material that covers the electronic component body, the first and second outer electrodes, a portion of the first metal terminal, and a portion of the second metal terminal. The second main surface of the element body is located on a side near a mounting surface of a mounting substrate on which the ceramic electronic component is to be mounted. The first metal terminal includes a first terminal joint portion that is connected to the first outer electrode, a first extension portion that is connected to the first terminal joint portion and that defines a gap between the second main surface of the electronic component body and the mounting surface of the mounting substrate, and a first mount portion that is connected to the first extension portion and that extends toward a side opposite to the electronic component body. The second metal terminal includes a second terminal joint portion that is connected to the second outer electrode, a second extension portion that is connected to the second terminal joint portion and that defines a gap between the second main surface of the electronic component body and the mounting surface of the mounting substrate, and a second mount portion that is connected to the second extension portion and that extends toward a side opposite to the electronic component body. The outer resin material includes a protruding portion that protrudes toward the mounting surface of the mounting substrate. The first mount portion includes a first protrusion that protrudes toward the mounting surface of the mounting substrate. The second mount portion includes a second protrusion that protrudes toward the mounting surface of the mounting substrate. Vertices of the first protrusion, the second protrusion, and the protruding portion are in contact the mounting surface.

In a ceramic electronic component according to a preferred embodiment of the present invention, a height of each of the first protrusion and the second protrusion from a side near the mounting surface of the first mount portion is preferably in a range from about 0.1 mm to about 0.5 mm.

In a ceramic electronic component according to a preferred embodiment of the present invention, a height of each of the first protrusion and the second protrusion from a side near the mounting surface of the first mount portion is preferably in a range from about 1% to about 6% of a distance between the first protrusion and the second protrusion.

In a ceramic electronic component according to a preferred embodiment of the present invention, a surface of each of the first metal terminal and the second metal terminal is preferably made of a black color material or an oxidized material.

According to a preferred embodiment of the present invention, a mounting structure for a ceramic electronic component is provided. The ceramic electronic component includes an element body including a first main surface and a second main surface that are opposed to one another; an electronic component body including a first outer electrode arranged on the element body, and a second outer electrode arranged on the element body; a first metal terminal connected to the first outer electrode; a second metal terminal connected to the second outer electrode; and an outer resin material that covers the electronic component body, the first and second outer electrodes, a portion of the first metal terminal, and a portion of the second metal terminal. The second main surface of the element body is located on a side near a mounting surface of a mounting substrate on which the ceramic electronic component is to be mounted. The first metal terminal includes a first terminal joint portion that is connected to the first outer electrode, a first extension portion that is connected to the first terminal joint portion and that defines a gap between the second main surface of the electronic component body and the mounting surface of the mounting substrate, and a first mount portion that is connected to the first extension portion and that extends toward a side opposite to the electronic component body. The second metal terminal includes a second terminal joint portion that is connected to the second outer electrode, a second extension portion that is connected to the second terminal joint portion and that defines a gap between the second main surface of the electronic component body and the mounting surface of the mounting substrate, and a second mount portion that is connected to the second extension portion and that extends toward a side opposite to the electronic component body. The outer resin material includes a protruding portion. The first mount portion includes a first protrusion that protrudes toward the mounting surface. The second mount portion includes a second protrusion that protrudes toward the mounting surface. Vertices of the first protrusion, the second protrusion, and the protruding portion are joined to the mounting surface of the mounting substrate. The joining is performed by welding to the mounting surface of the mounting substrate from a first recess on a side opposite to the mounting surface of the mounting substrate at a position of the first protrusion. The joining is performed by welding to the mounting surface of the mounting substrate from a second recess on a side opposite to the mounting surface of the mounting substrate at a position of the second protrusion.

In a mounting structure for a ceramic electronic component according to a preferred embodiment of the present invention, the joining by welding is preferably joining by laser welding that is performed by irradiating the first recess and the second recess with laser beams.

With preferred embodiments of the present invention, ceramic electronic components each including a metal terminal, and mounting structures for ceramic electronic components are provided, the electronic components being capable of being reliably welded and mounted even when a mounting substrate is warped, connection portions are not in one plane due to a step, and the electronic components have low coplanarity.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
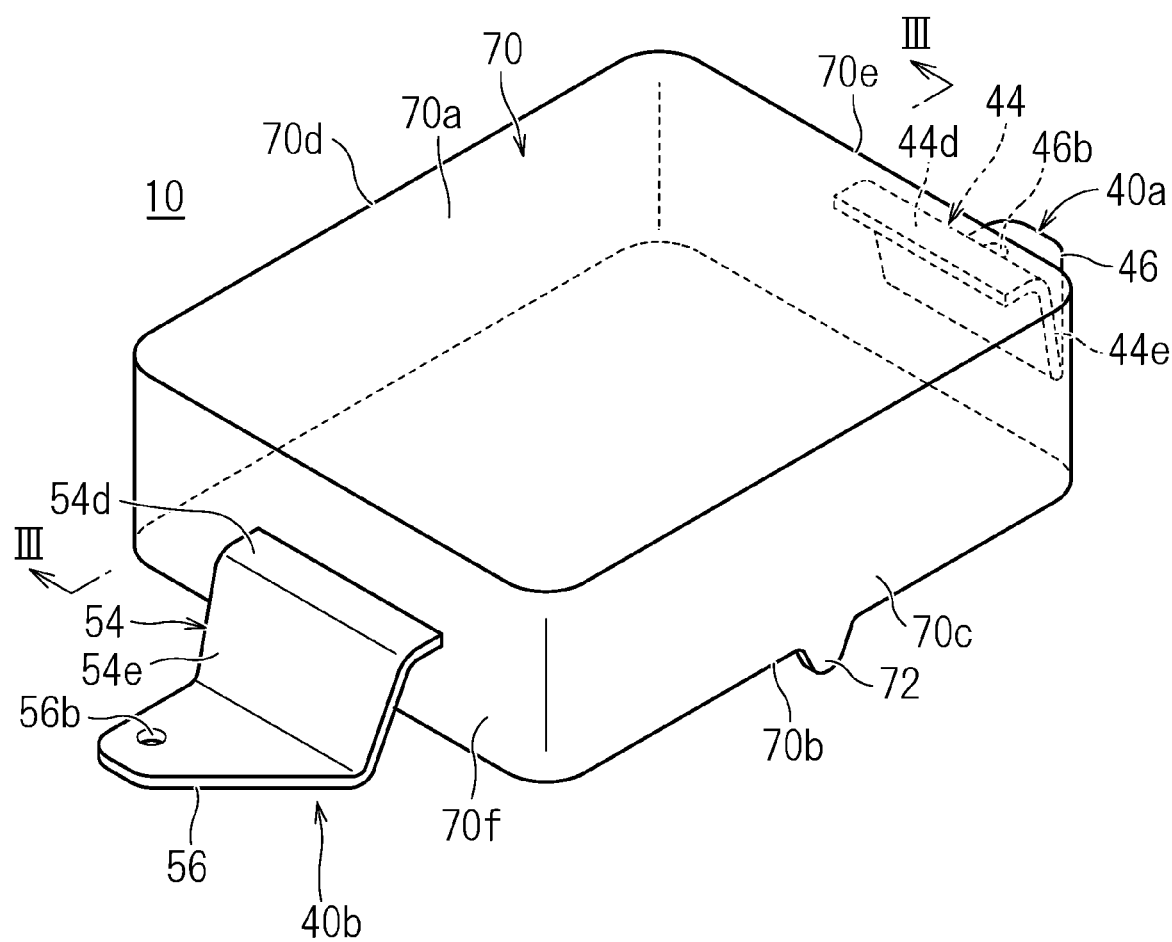
FIG. 1 is an external perspective view illustrating an example of a ceramic electronic component according to a first preferred embodiment of the present invention.
Figure 2:
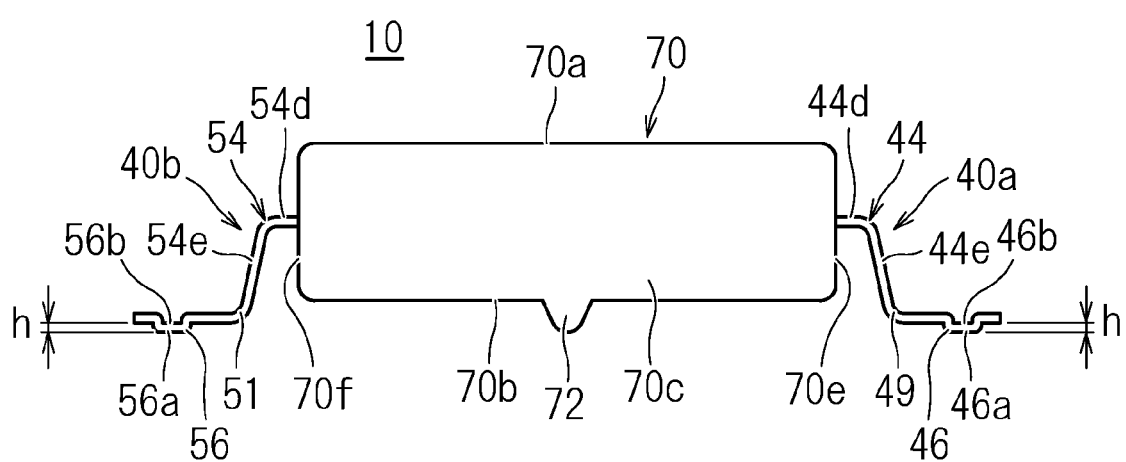
FIG. 2 is a side view of FIG. 1, illustrating the ceramic electronic component according to the first preferred embodiment of the present invention.
Figure 3:
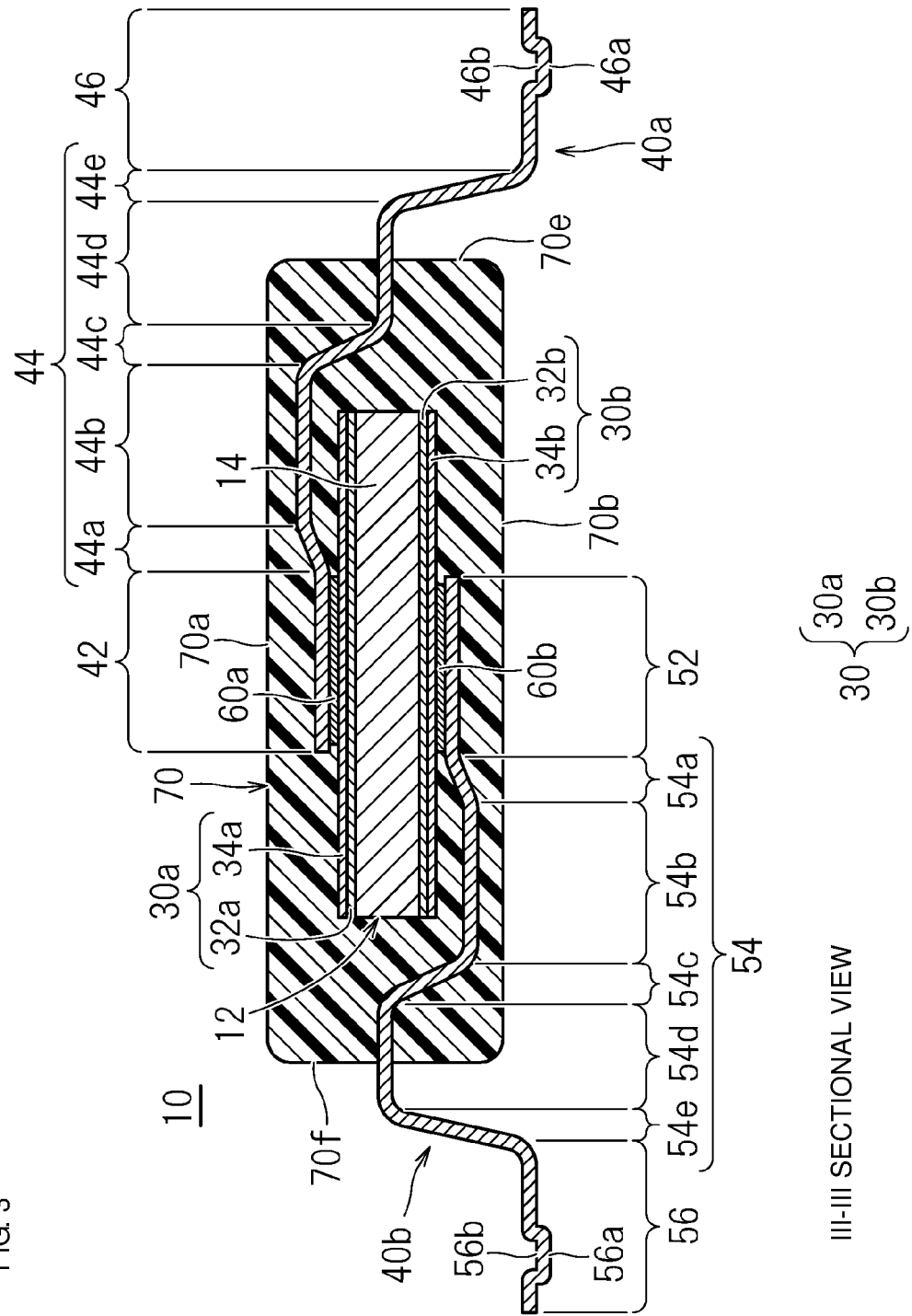
FIG. 3 is a sectional view taken along line III-III of FIG. 1, illustrating the ceramic electronic component according to the first preferred embodiment of the present invention.
Figure 4A:
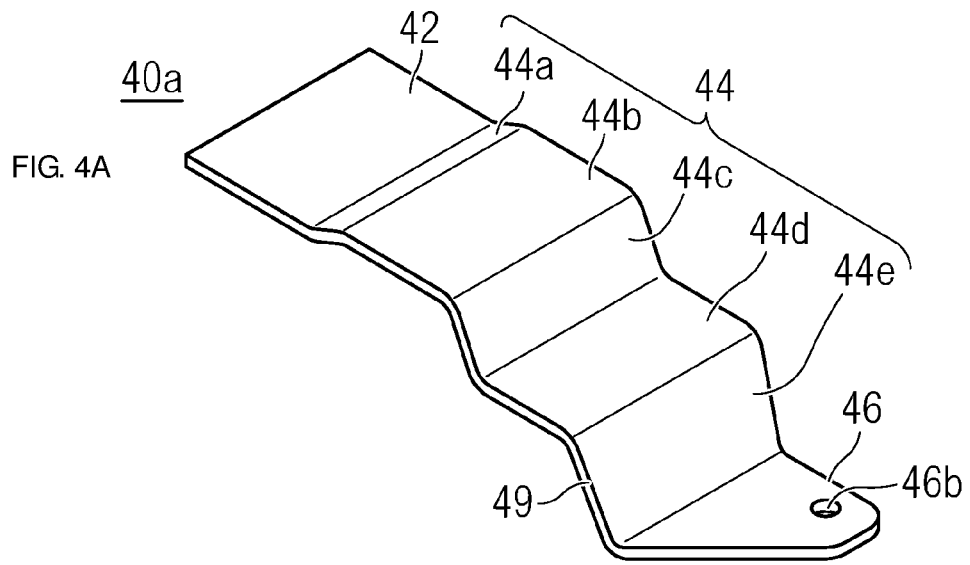
FIGS. 4A and 4B are external perspective views illustrating metal terminals included in the ceramic electronic component according to the first preferred embodiment of the present invention, FIG. 4A illustrating a first metal terminal, FIG. 4B illustrating a second metal terminal.
Figure 4B:
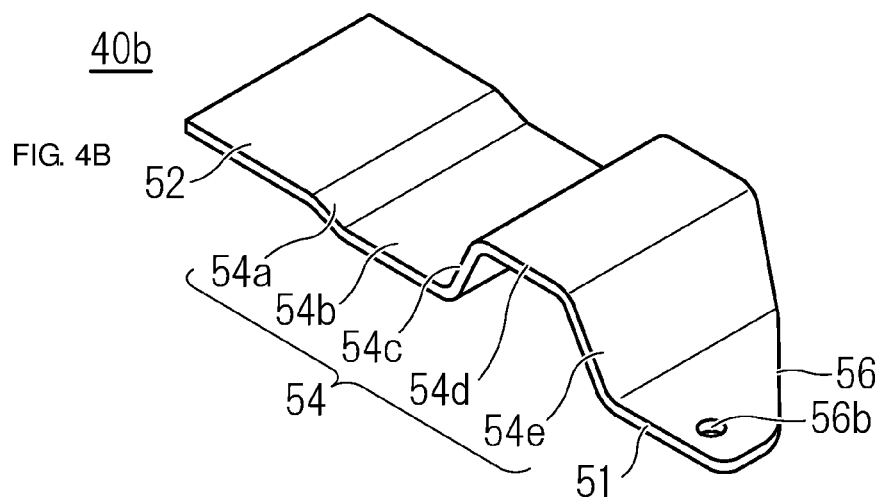
Figure 5:
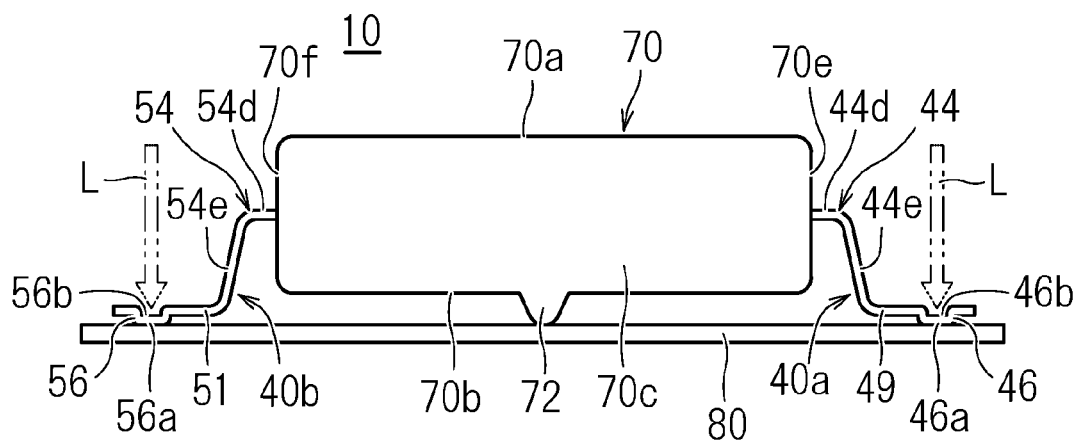
FIG. 5 is a schematic configuration diagram illustrating a state of a mounting structure for the ceramic electronic component according to the first preferred embodiment of the present invention.

A ceramic electronic component according to a first preferred embodiment of the present invention is described below. FIG. 1 is an external perspective view illustrating an example of the ceramic electronic component according to the first preferred embodiment of the present invention. FIG. 2 is a side view of FIG. 1, illustrating the ceramic electronic component according to the first preferred embodiment of the present invention. FIG. 3 is a sectional view taken along line III-III of FIG. 1, illustrating the ceramic electronic component according to the first preferred embodiment of the present invention. FIGS. 4A and 4B are external perspective views illustrating metal terminals included in the ceramic electronic component according to the first preferred embodiment of the present invention, FIG. 4A illustrating a first metal terminal, FIG. 4B illustrating a second metal terminal. FIG. 5 is a schematic configuration diagram illustrating a state of a mounting structure for the ceramic electronic component according to the first preferred embodiment of the present invention.

A ceramic electronic component 10 according to the first preferred embodiment of the present invention includes, for example, an electronic component body 12, and two metal terminals including a first metal terminal 40a and a second metal terminal 40b. The electronic component body 12 is connected to the first metal terminal 40a via a first joint material 60a. The electronic component body 12 is connected to the second metal terminal 40b via a second joint material 60b. Also, the ceramic electronic component 10 includes an outer resin material 70 that covers the electronic component body 12, at least a portion of the first metal terminal 40a, and at least a portion of the second metal terminal 40b.

The electronic component body 12 includes an element body 14. The element body 14 is preferably made of a single ceramic plate, and has a circular or substantially circular plate shape (substantially disk shape), for example. The element body 14 includes a first main surface 14a and a second main surface 14b that are opposed to one another, and a side surface 14c that connects the first main surface 14a and the second main surface 14b.

The material of the ceramic plate may preferably be dielectric ceramics including, for example, barium titanate ($BaTiO_3$), calcium titanate ($CaTiO_3$), strontium titanate ($SrTiO_3$), or calcium zirconate ($CaZrO_3$), as a main component. Also, a sub-component, such as a manganese (Mn) compound, a magnesium (Mg) compound, a silicon (Si) compound, a cobalt (Co) compound, or a nickel (Ni) compound, may be added to the main component, and the resultant may be used as the material of the ceramic plate. Alternatively, piezoelectric ceramics, such as PZT-based ceramics, or semiconductor ceramics, such as spinel-based ceramics, may be used.

Since the element body 14 is made of dielectric ceramics, the element body 14 functions as a capacitor. When the element body 14 uses piezoelectric ceramics, the element body 14 functions as a piezoelectric component. When the element body 14 uses semiconductor ceramics, the element body 14 functions as a thermistor.

The outer diameter dimension of the element body 14 is not particularly limited. However, the diameter of the element body 14 is preferably in a range from about 3.0 mm to about 6.0 mm, for example. Thus, the electronic component body 12 is reduced in size.

The thickness of the element body 14 is not particularly limited. However, the thickness of the element body 14 is preferably in a range from about 0.8 mm to about 1.2 mm, for example. Thus, the electronic component body 12 is reduced in height.

Outer electrodes 30 are provided on the first main surface 14a and the second main surface 14b of the element body 14. The outer electrodes 30 include a first outer electrode 30a and a second outer electrode 30b.

The first outer electrode 30a is disposed on a surface of the first main surface 14a of the element body 14. The second outer electrode 30b is disposed on a surface of the second main surface 14b of the element body 14.

As illustrated in FIG. 3, the first outer electrode 30a includes, in the order from the element body 14 side, a first underlying electrode layer 32a, and a first plated layer 34a provided on a surface of the first underlying electrode layer 32a. Similarly, the second outer electrode 30b includes, in the order from the element body 14 side, a second underlying electrode layer 32b, and a second plated layer 34b provided on a surface of the second underlying electrode layer 32b.

The first underlying electrode layer 32a is disposed on the first main surface 14a of the element body 14.

The second underlying electrode layer 32b is disposed on the second main surface 14b of the element body 14.

The first underlying electrode layer 32a and the second underlying electrode layer 32b (hereinafter, also merely referred to as underlying electrode layer) each include at least one selected from a baked layer, a thin-film layer, and other layers. In this case, the first underlying electrode layer 32a and the second underlying electrode layer 32b defined by baked layers are described.

The baked layer includes glass and metal. The metal of the baked layer preferably includes at least one selected from copper (Cu), Ni, silver (Ag), palladium (Pd), an Ag—Pd alloy, gold (Au), and other metal materials, for example. The glass of the baked layer preferably includes at least one selected from Si, Pd, lithium (Li), sodium (Na), potassium (K), and other glass materials, for example. The baked layer may include a plurality of baked layers. The baked layer is formed by applying conductive paste including glass and metal on the element body 14 and baking the conductive paste. The baked layer may be formed by firing the paste simultaneously with the ceramic plate, or by baking the paste after the ceramic plate is fired. The thickness of the thickest portion of the baked layer is preferably in a range from about 10 µm to about 100 µm, for example.

A resin layer including conductive particles and thermosetting resin may be provided on a surface of the baked layer. Alternatively, the resin layer may be directly provided on the element body 14 without the baked layer. The resin layer may include a plurality of resin layers. The thickness of the thickest portion of the resin layer is preferably in a range from about 20 µm to about 150 µm, for example.

The thin-film layer is formed by a thin film formation method, such as sputtering or vapor deposition, for example, and preferably has, for example, a thickness of about 1 µm or smaller in which metal particles are deposited.

The first plated layer 34a is provided on the surface of the first underlying electrode layer 32a and covers the first underlying electrode layer 32a. Similarly, the second plated layer 34b is provided on the surface of the second underlying electrode layer 32b and covers the second underlying electrode layer 32b.

The first plated layer 34a and the second plated layer 34b (hereinafter, also merely referred to as plated layer) preferably include, for example, at least one kind of metal selected from Cu, Ni, tin (Sn), Ag, Pd, an Ag—Pd alloy, Au, and other metal materials, or an alloy containing the metal.

The plated layer may include a plurality of layers. In this case, the plated layer preferably has a two-layer structure including a Ni-plated layer and a Sn-plated layer, for example. By providing the Ni-plated layer to cover the surface of the underlying electrode layer, the Ni-plated layer is used to prevent the underlying electrode layer from being eroded by solder when the first metal terminal 40a and the second metal terminal 40b are joined. By providing the Sn-plated layer on the surface of the Ni-plated layer, when the multilayer ceramic capacitor is mounted, the wettability of the solder that is used for the mounting is increased and the mounting is able to be easily performed.

The thickness of the single plated layer is preferably in a range from about 1 µm to about 20 µm, for example. Preferably, the plated layer does not include glass. Preferably, the ratio of metal of the plated layer per unit volume is about 99% by volume or more, for example.

Next, a case in which the first underlying electrode layer 32a and the second underlying electrode layer 32b are defined by plated electrodes is described. The first underlying electrode layer 32a is a plated layer, and is directly disposed on the surface of the first main surface 14a of the element body 14.

The second underlying electrode layer 32b is a plated layer, and is directly disposed on the surface of the second main surface 14b of the element body 14.

To enable the first underlying electrode layer 32a and the second underlying electrode layer 32b to be defined by the plated layers, a catalyst is provided on the element body 14 for pre-processing.

The first underlying electrode layer 32a defined by the plated layer is preferably covered with the first plated layer 34a. Similarly, the second underlying electrode layer 32b defined by the plated layer is preferably covered with the second plated layer 34b.

The first underlying electrode layer 32a and the second underlying electrode layer 32b, and the first plated layer 34a and the second plated layer 34b preferably include, for example, one metal selected from Cu, Ni, Sn, lead (Pb), Au, Ag, Pd, bismuth (Bi), and zinc (Zn), or an alloy containing the metal.

The first plated layer 34a and the second plated layer 34b are provided as necessary. The first outer electrode 30a may include only the first underlying electrode layer 32a, and the second outer electrode 30b may include only the second underlying electrode layer 32b. Alternatively, the first plated layer 34a and the second plated layer 34b may be provided as the outermost layers of the first outer electrode 30a and the second outer electrode 30b, or another plated layer may be provided on the first plated layer 34a or the second plated layer 34b.

The thickness of the single plated layer is preferably in a range from about 1 µm to about 15 µm, for example. Preferably, the plated layer does not include glass. Preferably, the ratio of metal of the plated layer per unit volume is about 99% by volume or more, for example. The first underlying electrode layer 32a and the second underlying electrode layer 32b, and the first plated layer 34a and the second plated layer 34b made of the plated layers are further plated by grain growth in the thickness direction, and preferably have a substantially columnar shape.

Metal terminals include the first metal terminal 40a and the second metal terminal 40b.

The metal terminals are provided to mount the ceramic electronic component 10 on the mounting substrate.

The first metal terminal 40a includes, for example, a plate-shaped or substantially plate-shaped lead frame. The first metal terminal 40a including the plate-shaped or substantially plate-shaped lead frame includes one main surface that is connected to the first outer electrode 30a, the other main surface that is opposed to the one main surface, and a peripheral surface that defines a thickness between the one main surface and the other main surface.

Similarly, the second metal terminal 40b includes, for example, a plate-shaped or substantially plate-shaped lead frame. The second metal terminal 40b including the plate-shaped or substantially plate-shaped lead frame include one main surface that is connected to the second outer electrode 30b, the other main surface that is opposed to the one main surface, and a peripheral surface that defines a thickness between the one main surface and the other main surface.

The first metal terminal 40a is connected to the first outer electrode 30a of the electronic component body 12 via the first joint material 60a.

The second metal terminal 40b is connected to the second outer electrode 30b of the electronic component body 12 via the second joint material 60b.

The first metal terminal 40a includes a first terminal joint portion 42 that is connected to the first main surface 14a of the element body 14, a first extension portion 44 that is connected to the first terminal joint portion 42 and that defines a gap between the second main surface 14b of the electronic component body 12 and the mounting surface, in a direction toward the mounting surface, and a first mount portion 46 that is connected to the first extension portion 44 and that is to be mounted on the mounting substrate.

The second metal terminal 40b includes a second terminal joint portion 52 that is connected to the second main surface 14b of the element body 14, a second extension portion 54 that is connected to the second terminal joint portion 52 and that defines a gap between the second main surface 14b of the electronic component body 12 and the mounting surface, in the direction toward the mounting surface, and a second mount portion 56 that is connected to the second extension portion 54 and that is to be mounted on the mounting substrate.

The first terminal joint portion 42 of the first metal terminal 40a is a portion that is connected to the first outer electrode 30a disposed on the surface of the first main surface 14a of the element body 14. The first terminal joint portion 42 has a plate shape or a substantial plate shape, and includes one main surface that faces the first main surface 14a of the element body 14 and that is connected to the first outer electrode 30a by using the first joint material 60a.

The second terminal joint portion 52 of the second metal terminal 40b is a portion that is connected to the second outer electrode 30b disposed on the surface of the second main surface 14b of the element body 14. The second terminal joint portion 52 has a plate shape or a substantial plate shape, and includes one main surface that faces the second main surface 14b of the element body 14 and that is connected to the second outer electrode 30b by using the second joint material 60b.

The first extension portion 44 includes a first extension-portion-defining member 44a that is connected to the first terminal joint portion 42 and that defines a gap with respect to the first main surface 14a of the element body 14, a second extension-portion-defining member 44b that is connected to the first extension-portion-defining member 44a and that extends in a direction parallel or substantially parallel to the first main surface 14a, a third extension-portion-defining member 44c that is connected to the second extension-portion-defining member 44b and that extends toward the element body 14, a fourth extension-portion-defining member 44d that is connected to the third extension-portion-defining member 44c and that extends in the direction parallel or substantially parallel to the first main surface 14a, and a fifth extension-portion-defining member 44e that is connected to the fourth extension-portion-defining member 44d and that extends in the direction toward the mounting surface. The first extension portion 44 defines a gap between the second main surface 14b of the electronic component body 12 and the mounting surface of the mounting substrate.

The second extension portion 54 includes a sixth extension-portion-defining member 54a that is connected to the second terminal joint portion 52 and that defines a gap with respect to the second main surface 14b of the element body 14, a seventh extension-portion-defining member 54b that is connected to the sixth extension-portion-defining member 54a and that extends in a direction parallel or substantially parallel to the second main surface 14b, an eighth extension-portion-defining member 54c that is connected to the seventh extension-portion-defining member 54b and that extends toward the element body 14, a ninth extension-portion-defining member 54d that is connected to the eighth extension-portion-defining member 54c and that extends in the direction parallel or substantially parallel to the second main surface 14b, and a tenth extension-portion-defining member 54e that is connected to the ninth extension-portion-defining member 54d and that extends in the direction toward the mounting surface. The second extension portion 54 defines a gap between the second main surface 14b of the electronic component body 12 and the mounting surface of the mounting substrate.

By providing the first extension portion 44 of the first metal terminal 40a, and the second extension portion 54 of the second metal terminal 40b, elastic deformation of the first metal terminal 40a and the second metal terminal 40b is able to absorb a mechanical strain that is generated in the ceramic plate when an alternating voltage is applied.

The first extension-portion-defining member 44a of the first metal terminal 40a is connected to the first terminal joint portion 42, and defines a gap with respect to the first main surface 14a of the element body 14. Specifically, the first extension-portion-defining member 44a bends at a terminal end of the first terminal joint portion 42, and extends in an opposite direction away from the first terminal joint portion 42 in the thickness direction of the element body 14. The angle of the bending portion may be gentle, or steep to be at a substantially right angle, for example. Since the first extension-portion-defining member 44a defines the gap with respect to the first main surface 14a, the flow path of the outer resin material 70 is secured, and voltage resistance and moisture resistance are increased. A surface of a portion of the first extension-portion-defining member 44a has a recessed shape or a substantially recessed shape. The base material of the first metal terminal 40a may be exposed at the recessed portion. Accordingly, if the first joint material 60a, for example, solder at the first terminal joint portion 42 is molten, the wettability of the solder is decreased because the base material of the first metal terminal 40a is exposed at the recessed portion, and thus, an outflow of the solder is able to be stopped. Thus, the molten solder is prevented from flowing out of the outer resin material 70.

The sixth extension-portion-defining member 44b of the second metal terminal 40b is connected to the second terminal joint portion 52, and defines a gap with respect to the second main surface 14b of the element body 14. Specifically, the sixth extension-portion-defining member 54a bends at a terminal end of the second terminal joint portion 52, and extends in an opposite direction away from the second terminal joint portion 52 in the thickness direction of the element body 14. Since the second extension-portion-defining member 54a defines the gap with respect to the second main surface 14b, the flow path of the outer resin material 70 is secured, and voltage resistance and moisture resistance are increased. A surface of a portion of the sixth extension-portion-defining member 54a has a recessed shape or a substantially recessed shape. The base material of the second metal terminal 40b may be exposed at the recessed portion. Accordingly, if the second joint material 60b, for example, solder at the second terminal joint portion 52 is molten, the wettability of the solder is decreased because the base material of the second metal terminal 40b is exposed at the recessed portion, and thus, an outflow of the solder is able to be stopped. Thus, the molten solder is prevented from flowing out of the outer resin material 70.

The second extension-portion-defining member 44b of the first metal terminal 40a is connected to the first extension-portion-defining member 44a, and extends in the direction parallel or substantially parallel to the first main surface 14a. Specifically, the second extension-portion-defining member 44b bends at a terminal end of the first extension-portion-defining member 44a, and extends in the direction parallel or substantially parallel to the first main surface 14a. A surface of a portion of the second extension-portion-defining member 44b has a recessed or a substantially recessed shape. The base material of the first metal terminal 40a may be exposed at the recessed portion. Accordingly, if the first joint material 60a, for example, solder at the first terminal joint portion 42 is molten, the wettability of the solder is decreased because the base material of the first metal terminal 40a is exposed at the recessed portion, and thus, an outflow of the solder is able to be stopped. Thus, the molten solder is prevented from flowing out of the outer resin material 70.

The seventh extension-portion-defining member 54b of the second metal terminal 40b is connected to the sixth extension-portion-defining member 54a, and extends in the direction parallel or substantially parallel to the second main surface 14b. Specifically, the seventh extension-portion-defining member 54b bends at a terminal end of the sixth extension-portion-defining member 54a, and extends in the direction parallel or substantially parallel to the second main surface 14b. A surface of a portion of the seventh extension-portion-defining member 54b has a recessed shape or a substantially recessed shape. The base material of the second metal terminal 40b may be exposed at the recessed portion. Accordingly, if the second joint material 60b, for example, solder at the second terminal joint portion 52 is molten, the wettability of the solder is decreased because the base material of the second metal terminal 40b is exposed at the recessed portion, and thus, an outflow of the solder is able to be stopped. Thus, the molten solder is prevented from flowing out of the outer resin material 70.

The third extension-portion-defining member 44c of the first metal terminal 40a is connected to the second extension-portion-defining member 44b, and extends toward the element body 14. Specifically, the third extension-portion-defining member 44c bends at a terminal end of the second extension-portion-defining member 44b, and extends toward an element-body center portion in the thickness direction of the element body 14. The angle of the bending portion may be gentle, or steep to be at a substantially right angle, for example.

The eighth extension-portion-defining member 54c of the second metal terminal 40b is connected to the seventh extension-portion-defining member 54b, and extends toward the element body 14. Specifically, the eighth extension-portion-defining member 54c bends at a terminal end of the seventh extension-portion-defining member 54b, and extends toward an element-body center portion in the thickness direction of the element body 14. The angle of the bending portion may be gentle, or steep to be at a substantially right angle, for example.

The fourth extension-portion-defining member 44d of the first metal terminal 40a is connected to the third extension-portion-defining member 44c, and extends in the direction parallel or substantially parallel to the first main surface 14a of the element body 14 again. Specifically, the fourth extension-portion-defining member 44d bends at a terminal end of the third extension-portion-defining member 44c, and extends in the direction parallel or substantially parallel to the first main surface 14a. The angle of the bending portion may be gentle, or steep to be at a substantially right angle, for example.

The ninth extension-portion-defining member 54d of the second metal terminal 40b is connected to the eighth extension-portion-defining member 54c, and extends in the direction parallel or substantially parallel to the second main surface 14b of the element body 14 again. Specifically, the ninth extension-portion-defining member 54d bends at a terminal end of the eighth extension-portion-defining member 54c, and extends in the direction parallel or substantially parallel to the second main surface 14b. The angle of the bending portion may be gentle, or steep to be at a substantially right angle, for example.

The fifth extension-portion-defining member 44e of the first metal terminal 40a is connected to the fourth extension-portion-defining member 44d, and extends in the direction toward the mounting surface. Specifically, the fifth extension-portion-defining member 44e bends at a terminal end of the fourth extension-portion-defining member 44d, and extends in the direction toward the mounting surface. The angle of the bending portion may be gentle, or steep to be at a substantially right angle, for example.

The tenth extension-portion-defining member 54e of the second metal terminal 40b is connected to the ninth extension-portion-defining member 54d, and extends in the direction toward the mounting surface. Specifically, the tenth extension-portion-defining member 54e bends at a terminal end of the ninth extension-portion-defining member 54d, and extends in the direction toward the mounting surface. The angle of the bending portion may be gentle, or steep to be at a right angle or substantially a right angle, for example.

The first mount portion 46 of the first metal terminal 40a is connected to the fifth extension-portion-defining member 44e and is mounted on the mounting substrate. Specifically, the first mount portion 46 bends at a terminal end of the fifth extension-portion-defining member 44e, and extends parallel or substantially parallel to the mounting surface.

The shape of the first mount portion 46 is preferably triangular or substantially triangular in plan view, for example. The first mount portion 46 includes a first protrusion 46a that is sufficiently pressed and deformed in a circular or substantially circular shape and protrudes toward the mounting surface of the mounting substrate. A recess on the side opposite to the mounting surface of the mounting substrate at the first protrusion 46a defines and functions as a first recess 46b. The shape in plan view of the first mount portion 46 is not limited to the substantially triangular shape, and may be a quadrangular or substantially quadrangular shape, for example.

The second mount portion 56 of the second metal terminal 40b is connected to the tenth extension-portion-defining member 54e and is mounted on the mounting substrate. Specifically, the second mount portion 56 bends at a terminal end of the tenth extension-portion-defining member 54e, and extends parallel or substantially parallel to the mounting surface.

The shape of the second mount portion 56 is preferably triangular or substantially triangular in plan view, for example. The second mount portion 56 includes a second protrusion 56a that is sufficiently pressed and deformed in a circular or substantially circular shape and protrudes toward the mounting surface of the mounting substrate. A recess on the side opposite to the mounting surface of the mounting substrate at the second protrusion 56a defines and functions as a second recess 56b. The shape in plan view of the second mount portion 56 is not limited to the substantially triangular shape, and may be a quadrangular or substantially quadrangular shape, for example.

The first protrusion 46a is preferably disposed at one of end sides of the first mount portion 46 in a direction orthogonal or substantially orthogonal to a direction in which the metal terminal extends. The second protrusion 56a is preferably disposed at one of end sides of the second mount portion 56 in a direction orthogonal or substantially orthogonal to a direction in which the metal terminal extends. At this time, the first protrusion 46a and the second protrusion 56a are preferably located at end portions on the same side in the direction orthogonal or substantially orthogonal to the direction in which the metal terminals extend. In particular, the first protrusion 46a and the second protrusion 56a are preferably located on the side opposite to the oblique edges that define the first mount portion 46 and the second mount portion 56.

Also, the first mount portion 46 of the first metal terminal 40a, and the second mount portion 56 of the second metal terminal 40b have small contact areas with respect to the mounting substrate. Welding is able to be performed by merely irradiating, with laser beams, the first recess 46b on the side opposite to the mounting surface of the mounting substrate at the first protrusion 46a, and the second recess 56b on the side opposite to the mounting surface of the mounting substrate at the second protrusion 56a. Thus, the welding time is decreased.

The first protrusion 46a and the second protrusion 56a may be angular or rounded.

In the ceramic electronic component 10 according to the present preferred embodiment, the height h of each of the first protrusion 46a and the second protrusion 56a is preferably in a range from about 0.1 mm to about 0.5 mm, for example, from a bottom surface of the first mount portion 46 or the second mount portion 56. Alternatively, the height h of each of the first protrusion 46a and the second protrusion 56a is preferably in a range from about 1% to about 6%, for example, of the distance between the first protrusion 46a and the second protrusion 56a. Accordingly, undulations of the board surface and low coplanarity of the electronic component are absorbed, and the protrusions securely contact the board. In addition, irradiation with laser beams is able to be reliably provided. Thus, the advantages according to preferred embodiments of the present invention are more effective.

The first metal terminal 40a and the second metal terminal 40b each include a terminal body, and a plated film provided on a surface of the terminal body.

The terminal body is preferably made of a metal selected from Ni, iron (Fe), Cu, Ag, and chromium (Cr), or an alloy including as a main component at least one of the metals, for example. Specifically, for example, the base material of the terminal body is a Fe-18Cr alloy, a Fe-42Ni alloy, or a Cu-8Sn alloy. The thickness of the terminal body of the metal terminal 16 is preferably in a range from about 0.05 mm to about 0.5 mm, for example.

The plated film includes a lower-layer plated film and an upper-layer plated film. The lower-layer plated film is provided on the surface of the terminal body, and the upper-layer plated film is provided on the surface of the lower-layer plated film. Each of the lower-layer plated film and the upper-layer plated film may include a plurality of plated films.

The lower-layer plated film is made of, for example, a metal selected from Ni, Fe, Cu, Ag, and Cr, or an alloy including as a main component at least one of the metals.

The lower-layer plated film is preferably made of a metal selected from Ni, Fe, and Cr, or an alloy including as a main component at least one of the metals, for example.

The upper-layer plated film is made of a metal selected from Sn, Ag, and Au, or an alloy including as a main component at least one of the metals, for example. The upper-layer plated film is preferably made of Sn, or an alloy including Sn as a main component, for example. If the upper-layer plated film is made of Sn or an alloy including Sn as a main component, solderability between the metal terminal and the outer electrode 30 is increased.

The thickness of the lower-layer plated film is preferably in a range from about 0.2 μm to about 5.0 μm, for example. The thickness of the upper-layer plated film is preferably in a range from about 1.0 μm to about 5.0 μm, for example.

Each of the terminal body and the lower-layer plated film is preferably made of a metal selected from Ni, Fe, and Cr whose melting points are high, or an alloy including as a main component at least one of the metals, for example. Thus, heat resistance of the outer electrode 30 is increased.

The plated film may not be provided on at least a peripheral surface 49 of the first extension portion 44 and the first mount portion 46 of the first metal terminal 40a, and a peripheral surface 51 of the second extension portion 54 and the second mount portion 56 of the second metal terminal 40b. Thus, when the ceramic electronic component 10 is mounted on the mounting substrate using solder, the solder does not spread upward on the first metal terminal 40a and the second metal terminal 40b. Since the solder does not spread upward in the area (lift-up portion) between the electronic component body 12 and each of the first and second metal terminals 40a and 40b, the lift-up portion is prevented from being filled with the solder. Accordingly, the space of the lift-up portion is sufficiently secured. Since the first extension portion 44 of the first metal terminal 40a, and the second extension portion 54 of the second metal terminal 40b are easily elastically deformed, the elastic deformation is able to absorb a mechanical strain that is generated in the element body 14 when an alternating voltage is applied. The plated film may not be provided on the entire peripheral surfaces of the first metal terminal 40a and the second metal terminal 40b.

To remove the plated film on the first extension portion 44 and the first mount portion 46 of the first metal terminal 40a, and the second extension portion 54 and the second mount portion of the second metal terminal 40b, or the entire peripheral surfaces of the first metal terminal 40a and the second metal terminal 40b, for example, a method of removing the plated film by using a machine (cutting, grinding); a method of removing the plated film by using laser trimming; a method of removing the plated film by using a plating parting agent (for example, sodium hydroxide); or a method of covering portions, on which plating is not applied, with resist films before the plated films of the first metal terminal 40a and the second metal terminal 40b are formed, forming the plated films on the first metal terminal 40a and the second metal terminal 40b, and then removing the resist films after the plated films are formed on the first metal terminal 40a and the second metal terminal 40b may be used.

The lower-layer plated film is preferably made of a metal selected from Ni, Fe, Cu, Ag, and Cr, or an alloy including as a main component at least one of the metals, for example. More preferably, the lower-layer plated film is made of a metal selected from Ni, Fe, and Cr, or an alloy including as a main component at least one of the metals, for example. The lower-layer plated film is preferably made of a metal selected from Ni, Fe, and Cr whose melting points are high, or an alloy including as a main component at least one of the metals, for example. Thus, heat resistance of the outer electrode 30 is increased. The thickness of the lower-layer plated film is preferably in a range from about 0.2 µm to about 5.0 µm, for example.

The upper-layer plated film is preferably made of a metal selected from Sn, Ag, and Au, or an alloy including as a main component at least one of the metals, for example. More preferably, the upper-layer plated film is made of Sn, or an alloy including Sn as a main component, for example. Since the upper-layer plated film is made of Sn or an alloy including Sn as a main component, solderability between the first and second metal terminals 40a and 40b and the outer electrode 30 is increased. The thickness of the upper-layer plated film is preferably in a range from about 1.0 µm to about 5.0 µm, for example.

Each of the terminal body and the lower-layer plated film is preferably made of, for example, a metal selected from Ni, Fe, and Cr with high melting points, or an alloy including as a main component at least one of the metals, for example. Thus, heat resistance of the outer electrode 30 is increased.

The outer resin material 70 covers the element body 14, the first outer electrode 30a, the second outer electrode 30b, a portion of the first metal terminal 40a, a portion of the second metal terminal 40b, the first joint material 60a between the first outer electrode 30a and the first metal terminal 40a, and the second joint material 60b between the second outer electrode 30b and the second metal terminal 40b.

The outer resin material 70 has a rectangular or substantially rectangular-parallelepiped shape. The outer resin material 70 includes a first main surface 70a and a second main surface 70b that respectively face the first main surface 14a and the second main surface 14b of the element body 14, a first side surface 70c and a second side surface 70d that are orthogonal or substantially orthogonal to the first main surface 70a and the second main surface 70b, and that extend in the direction in which the metal terminals extend, and a first end surface 70e and a second end surface 70f that are orthogonal or substantially orthogonal to the first main surface 70a, the second main surface 70b, the first side surface 70c, and the second side surface 70d. The shapes of the corner portions of the outer resin material 70 are not particularly limited and may be rounded.

The first main surface 70a and the second main surface 70b of the outer resin material 70 may have planar or substantially planar shapes.

The outer resin material 70 is preferably made, for example, by applying liquid or powder silicone-based or epoxy-based resin. The outer resin material 70 may be molded by a method of injection molding engineering plastics or a method of transfer molding engineering plastics, for example. In particular, the outer resin material 70 is preferably made of thermosetting epoxy resin, for example. Thus, adhesion between the outer resin material 70 and the element body 14, or between the outer resin material 70 and the first and second metal terminals 40a and 40b is secured, and the advantageous effects of increasing voltage resistance and moisture resistance are obtained.

A protruding portion 72 that protrudes toward the mounting surface is provided at a surface of the outer resin material 70 on the mounting surface side (the second main surface 70b side). The protruding portion 72, together with the first protrusion 46a of the first metal terminal 40a and the second protrusion 56a of the second metal terminal 40b, are provided such that the vertices of the protruding portion and protrusions contact the mounting surface of the mounting substrate. With this configuration according to the present preferred embodiment, point contact or surface contact in a small area is provided at each of three positions on the mounting surface of the mounting substrate. Accordingly, even when the mounting substrate is warped, or even when the connection positions are not in one plane due to a step, the contact state at the three positions is securely provided, and mounting by welding is reliably performed.

The height of the protruding portion 72 is not particularly limited, and is adjusted such that the vertex of the protruding portion 72, together with the vertices of the first protrusion 46a of the first metal terminal 40a and the second protrusion 56a of the second metal terminal 40b, contacts the mounting surface of the mounting substrate.

The position at which the protruding portion 72 is provided is determined so that the first protrusion 46a, the second protrusion 56a, and the protruding portion 72 are not located in one straight line. The protruding portion 72 is provided at the surface of the outer resin material 70 on the mounting surface side (the second main surface 70b side) on the side opposite to the side on which the first protrusion 46a of the first metal terminal 40a and the second protrusion 56a of the second metal terminal 40b are provided, with respect to the direction orthogonal to the direction in which the metal terminals extend. In particular, the protruding portion 72 is preferably located at an end portion of the surface of the outer resin material 70 on the mounting surface side (the second main surface 70b side), at a position near the center in the direction in which the metal terminals extend. Accordingly, the first protrusion 46a, the second protrusion 56a, and the protruding portion 72 contact the mounting surface of the mounting substrate more stably at three support points.

The first outer electrode 30a and the first metal terminal 40a are connected by the first joint material 60a. The second outer electrode 30b and the second metal terminal 40b are connected by the second joint material 60b. For the first joint material 60a and the second joint material 60b, solder or a conductive adhesive, for example, may be used.

When the solder is used, for example, it is preferable to use lead-free (LF) solder, such as tin-antimony-based (Sn—Sb-based), Sn—Ag—Cu-based, Sn—Cu-based, or Sn—Bi-based LF solder. In the case of Sn—Sb-based solder, the percentage of content of Sb is preferably in a range from about 5% to about 15%, for example.

When the conductive adhesive is used, a bonding agent in which a metal filler made of Ag or other suitable material is added to thermosetting resin, such as epoxy resin, for example, is preferably used.

A dimension L is a dimension of the ceramic electronic component 10 in a direction in which the metal terminals of the ceramic electronic component 10 extend, the ceramic electronic component 10 including the outer resin material 70, the first metal terminal 40a, and the second metal terminal 40b; a dimension T is a dimension of the ceramic electronic component 10 in a thickness direction of the outer resin material 70 (a direction in which the first main surface 70a and the second main surface 70b of the outer resin material 70 are coupled to one another); and a dimension W is a dimension of the ceramic electronic component 10 in a width direction of the outer resin material 70 (a direction in which the first side surface 70c and the second side surface 70d of the outer resin material 70 are coupled to one another).

The dimensions of the ceramic electronic component 10 are not particularly limited. However, preferably, the dimension L in the direction in which the metal terminals extend is in a range from about 5 mm to about 25 mm, the dimension W in the width direction is in a range from about 4 mm to about 10 mm, and the dimension T in the thickness direction is in a range from about 1 mm to about 6 mm, for example.

Next, a mounting structure for the ceramic electronic component 10 according to the present preferred embodiment is described.

As illustrated in FIG. 5, the ceramic electronic component 10 is mounted on a mounting substrate 80. Specifically, the ceramic electronic component 10 is disposed on a mounting surface of the mounting substrate 80, and is joined to the mounting substrate 80 by welding at the first protrusion 46a of the first mount portion 46 of the first metal terminal 40a, and the second protrusion 56a of the second mount portion 56 of the second metal terminal 40b.

The joining by welding is preferably joining by welding using laser beams L. That is, mounting by welding is performed by irradiating, with the laser beams L, the first recess 46b on the side opposite to the mounting surface of the mounting substrate 80 at the position of the first protrusion 46a, and the second recess 56b on the side opposite to the mounting surface of the mounting substrate 80 at the position of the second protrusion 56a.

With the ceramic electronic component 10 according to the present preferred embodiment, since the first protrusion 46a of the first mount portion 46, the second protrusion 56a of the second mount portion 56, and the protruding portion 72 of the outer resin material 70 are provided, the ceramic electronic component 10 contacts the mounting surface of the mounting substrate 80 at three positions, by point contact or surface contact with a small surface. Accordingly, even when the mounting substrate 80 is warped, or even when the connection positions are not in one plane due to a step, the contact on the mounting substrate 80 at the three positions is securely provided, and mounting by laser welding is reliably performed.

With the mounting structure for the ceramic electronic component 10 according to the present preferred embodiment, the vertex of the first protrusion 46a of the first metal terminal 40a, the vertex of the second protrusion 56a of the second metal terminal 40b, and the vertex of the protruding portion 72 of the outer resin material 70 are in contact with the mounting surface of the mounting substrate 80. The contact area is small, and mounting by welding is able to be performed by irradiating, with the laser beams L, the portions with the small areas of the first recess 46b and the second recess 56b. Thus, mounting by welding is easily performed in a short period of time.

Next, a preferred embodiment of a method of manufacturing the ceramic electronic component according to the first preferred embodiment having the above-described configuration is described, referring to the ceramic electronic component 10 as an example.

First, a raw material for manufacturing an element body is prepared and weighted.

Rounded stones are added to the raw material, and the raw material is mixed, crushed, stirred, and thus prepared.

Then, the prepared raw material is dried by a spray dryer or other suitable dryer.

Then, an additive, a binder, or other suitable material, is added to the raw material, thus a two-component raw material is prepared, the raw material is finely grounded, and then calcined.

The calcined raw material is shaped into a sheet or substantial sheet shape using an extruding machine or other suitable machine.

Then, the molded sheet having the sheet or substantial sheet shape is punched into a disk or substantially disk tablet shape using a press forming machine or other suitable machine. The punched sheet having the disk or substantially disk shape is placed into a firing furnace, firing is performed, and thus the disk or substantial disk shaped element body 14 is manufactured. The firing temperature is preferably in a range from about 1100° C. to about 1400° C., for example, depending on the dielectric material.

Then, baked layers of the outer electrode 30 are formed on both main surfaces of the element body 14. To form the first outer electrode 30a, outer-electrode conductive paste is applied to the first main surface 14a of the element body 14 and baked. Similarly, to form the second outer electrode 30b, outer-electrode conductive paste is applied to the second main surface 14b of the element body 14 and baked. Thus, the baked layers are formed. As necessary, at least one plated layer is formed on a surface of each of the baked layers, the outer electrode 30 is formed, and the electronic component body 12 is manufactured.

Alternatively, for the outer electrode 30, instead of forming the baked layers, a portion of a surface of the element body 14 on the first main surface 14a side may be plated and thus an underlying plated film may be formed. Similarly, a portion of the surface of the element body 14 on the second main surface 14b side may be plated and hence an underlying plated film may be formed. In this manner, the plated electrodes are directly formed on the first main surface 14a and the second main surface 14b of the element body 14.

The plating may be either of electrolytic plating and non-electrolytic plating. Non-electrolytic plating requires pre-processing with a catalyst to increase the plating precipitation speed, and the process may be complicated. Thus, electrolytic plating is preferably used. For the plating method, barrel plating is preferably used.

The first metal terminal 40a and the second metal terminal 40b are prepared. The first metal terminal 40a and the second metal terminal 40b are shaped by bending.

First, the second joint material 60b is applied to an upper surface of the second terminal joint portion 52 of the second metal terminal 40b (the surface facing the second main surface 14b of the element body 14). In this case, solder is used for the second joint material 60b.

Then, the electronic component body 12 is inserted into the area between the first metal terminal 40a and the second metal terminal 40b.

Then, the first joint material 60a is applied to a contact surface between the first metal terminal 40a and the first outer electrode 30a. In this case, solder is used for the first joint material 60a.

Then, reflow soldering is performed, and the first metal terminal 40a and the second metal terminal 40b are attached to the electronic component body 12.

Then, the outer resin material 70 is formed. The outer resin material 70 is formed, for example, by applying liquid or powder silicone-based or epoxy-based resin by dip coating to the electronic component body 12 to which the metal terminals are attached, and hardening the resin. The hardening temperature is preferably in a range from about 150° C. to about 200° C., for example, depending on the material of epoxy resin. The outer resin material 70 may be molded by a method of injection molding engineering plastics or a method of transfer molding engineering plastics, for example. In particular, the outer resin material 70 is preferably made of thermosetting epoxy resin, for example.

Then, after the outer resin material 70 is formed, the metal terminals protruding from the outer resin material 70 are bent along the side surfaces and bottom surface of the outer resin material 70, and the ceramic electronic component 10 illustrated in FIG. 1 is obtained.

Second Preferred Embodiment

Figure 6:
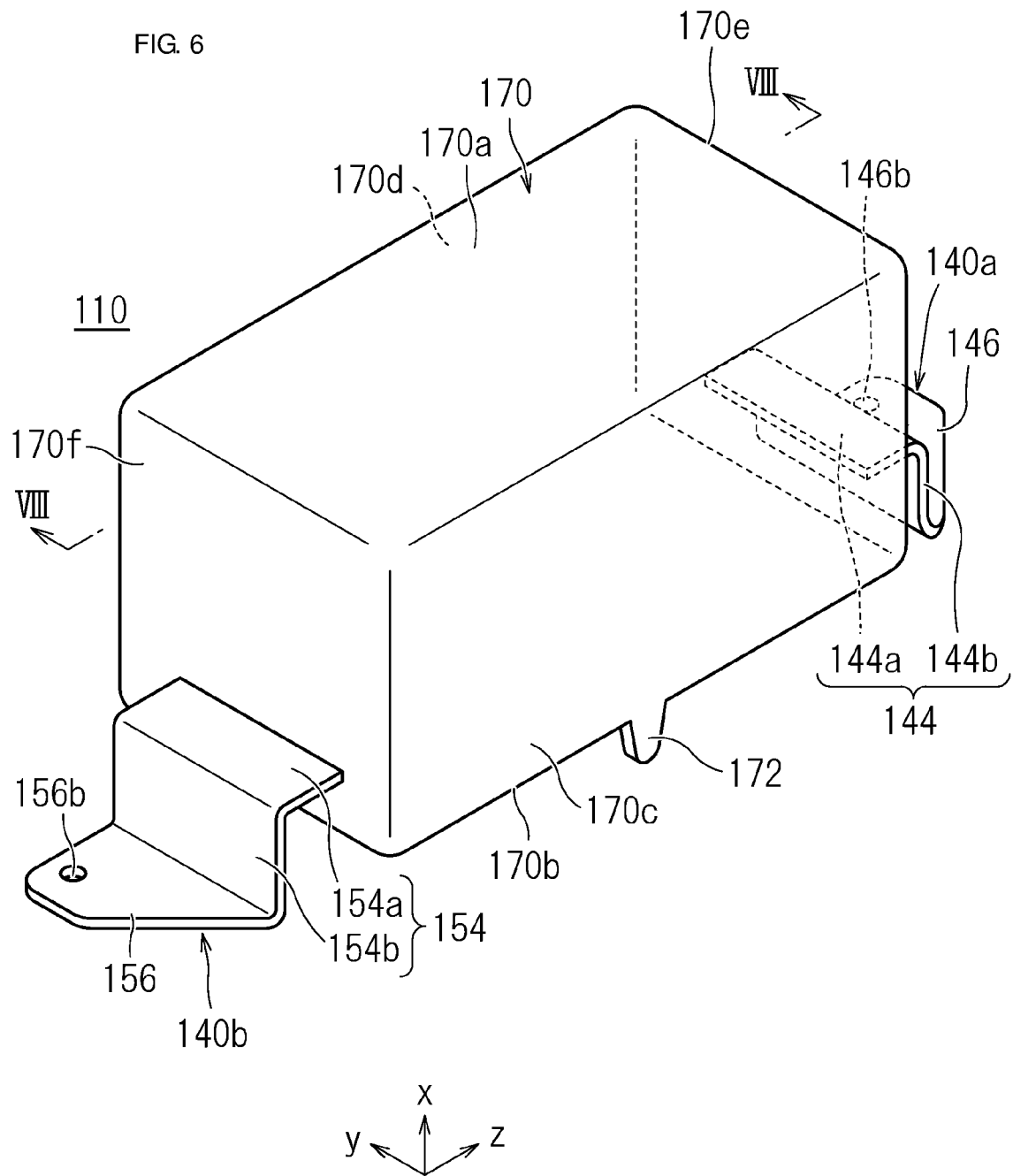
FIG. 6 is an external perspective view illustrating an example of a ceramic electronic component according to a second preferred embodiment of the present invention.
Figure 7:
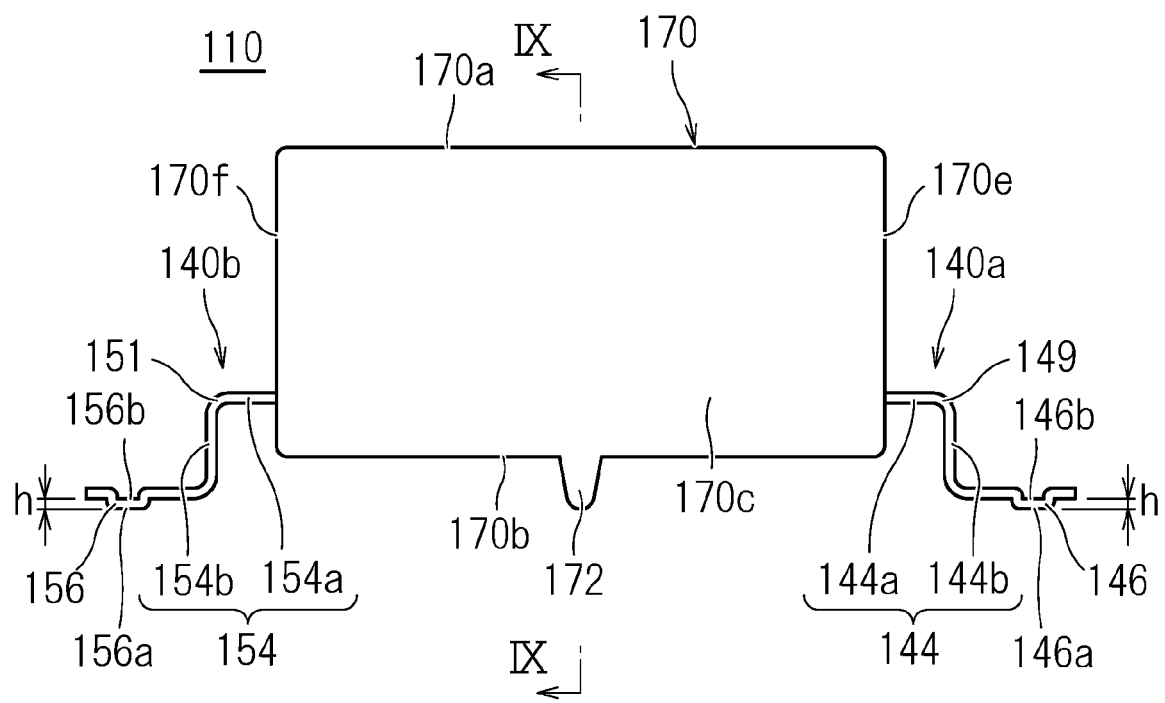
FIG. 7 is a side view of FIG. 6, illustrating the ceramic electronic component according to the second preferred embodiment of the present invention.
Figure 8:
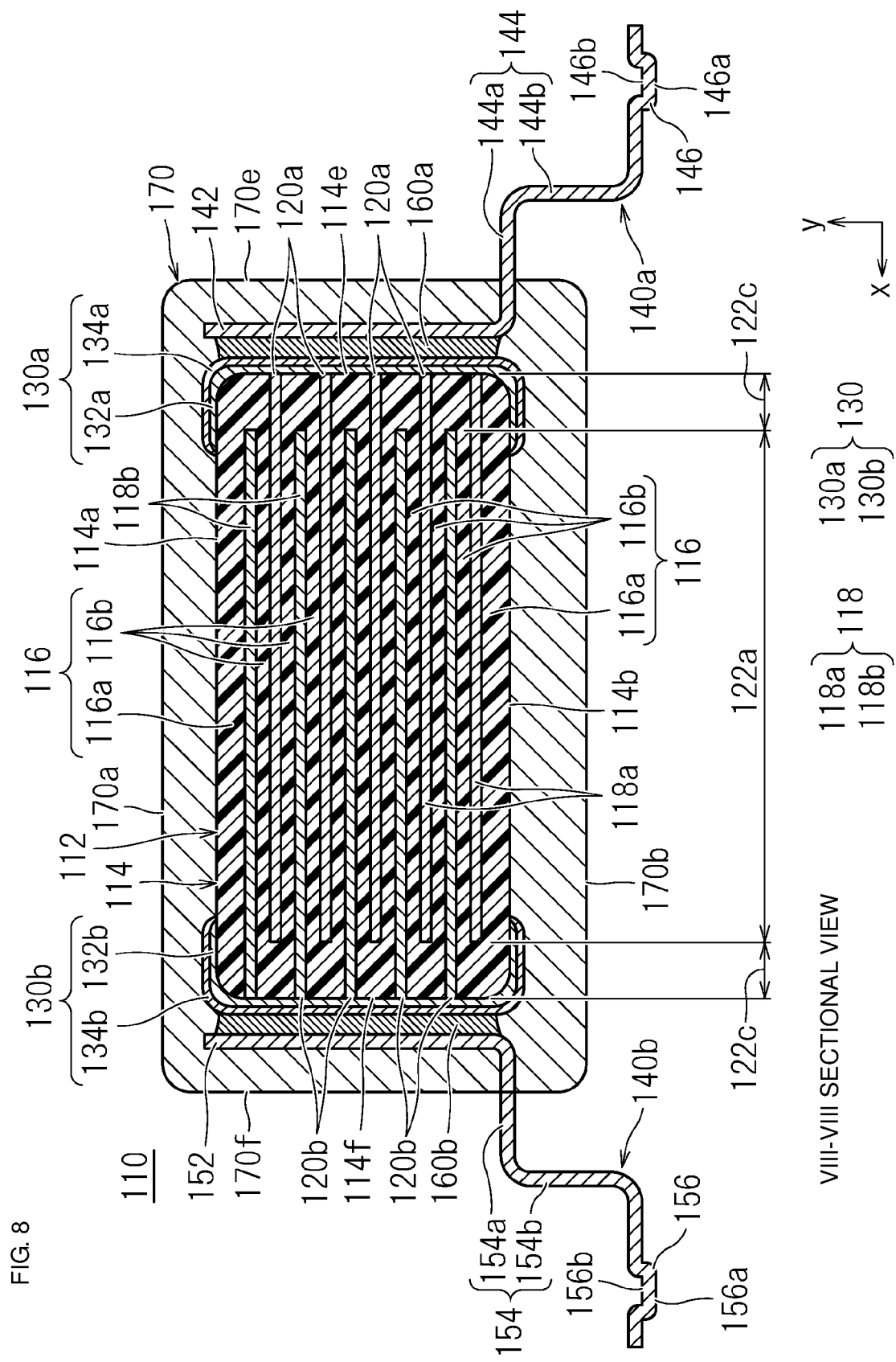
FIG. 8 is a sectional view taken along line VIII-VIII of FIG. 6, illustrating the ceramic electronic component according to the second preferred embodiment of the present invention.
Figure 9:
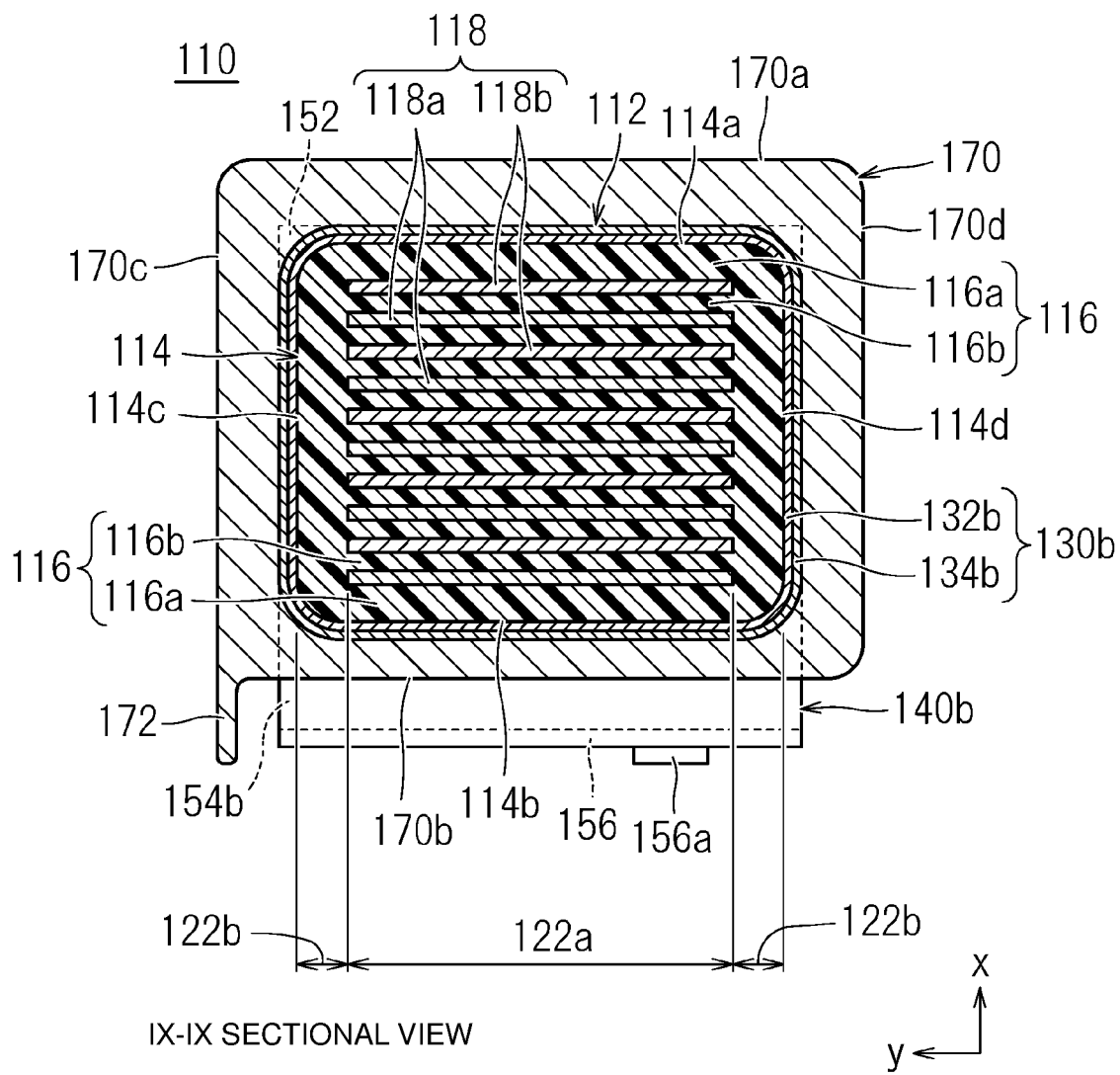
FIG. 9 is a sectional view taken along line IX-IX of FIG. 6, illustrating the ceramic electronic component according to the second preferred embodiment of the present invention.
Figure 10A:
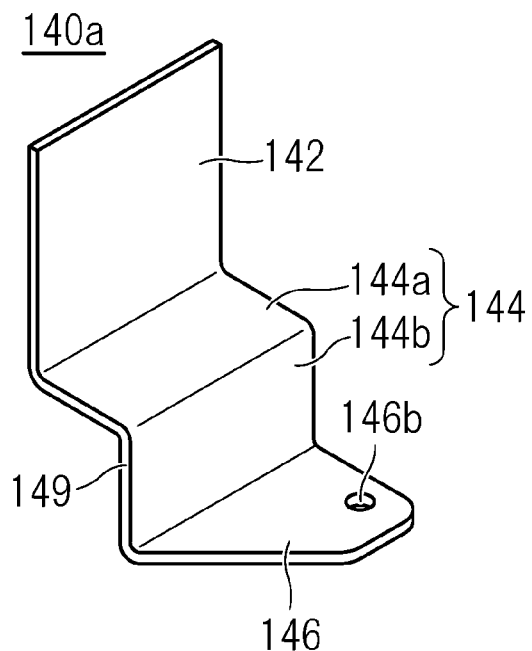
FIGS. 10A and 10B are external perspective views illustrating metal terminals included in the ceramic electronic component according to the second preferred embodiment of the present invention, FIG. 10A illustrating a first metal terminal, FIG. 10B illustrating a second metal terminal.
Figure 10B:
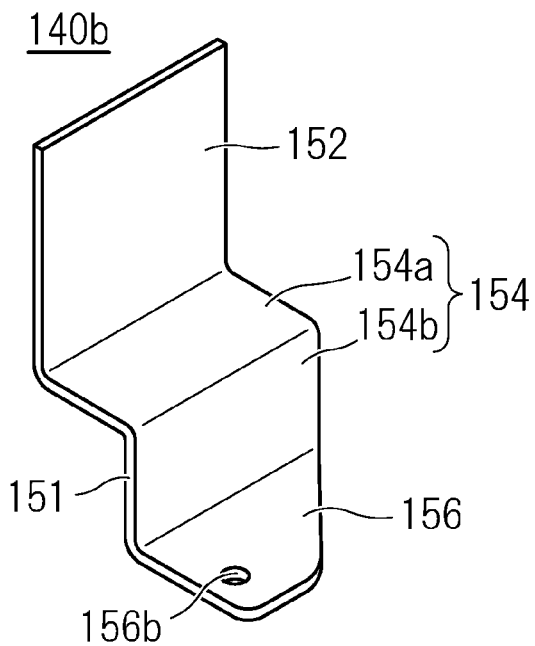
Figure 11:
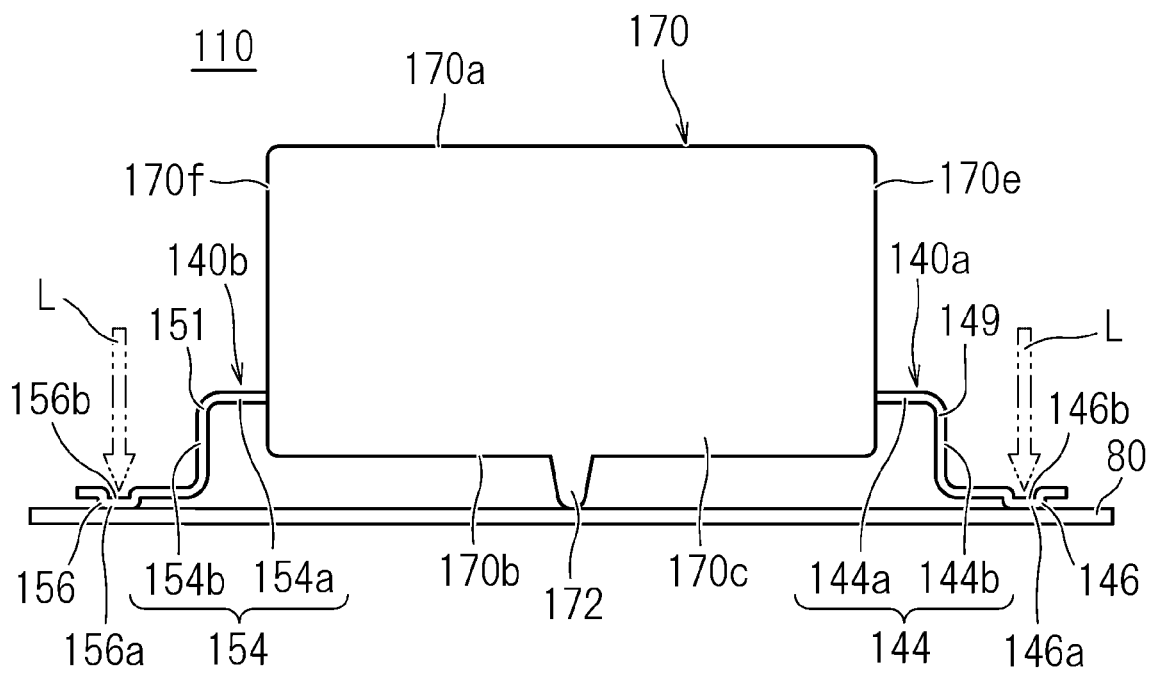
FIG. 11 is a schematic configuration diagram illustrating a state of a mounting structure for the ceramic electronic component according to the second preferred embodiment of the present invention.

A ceramic electronic component according to a second preferred embodiment of the present invention is described. FIG. 6 is an external perspective view illustrating an example of a ceramic electronic component according to the second preferred embodiment of the present invention. FIG. 7 is a side view of FIG. 6, illustrating the ceramic electronic component according to the second preferred embodiment of the present invention. FIG. 8 is a sectional view taken along line VIII-VIII of FIG. 6, illustrating the ceramic electronic component according to the second preferred embodiment of the present invention. FIG. 9 is a sectional view taken along line IX-IX of FIG. 6, illustrating the ceramic electronic component according to the second preferred embodiment of the present invention. FIGS. 10A and 10B are external perspective views illustrating metal terminals included in the ceramic electronic component according to the second preferred embodiment of the present invention, FIG. 10A illustrating a first metal terminal, FIG. 10B illustrating a second metal terminal. FIG. 11 is a schematic configuration diagram illustrating a state of a mounting structure for the ceramic electronic component according to the second preferred embodiment of the present invention.

A ceramic electronic component 110 according to the second preferred embodiment of the present invention includes, for example, an electronic component body 112, and two metal terminals including a first metal terminal 140a and a second metal terminal 140b. The electronic component body 112 is connected to the first metal terminal 140a via a first joint material 160a. The electronic component body 112 is connected to the second metal terminal 140b via a second joint material 160b. Also, the ceramic electronic component 110 includes an outer resin material 170 that covers the electronic component body 112, at least a portion of the first metal terminal 140a, and at least a portion of the second metal terminal 140b.

The electronic component body 112 includes a rectangular or substantially rectangular-parallelepiped element body 114.

The element body 114 includes, in a stacked manner, a plurality of ceramic layers 116, and a plurality of inner electrode layers 118. Further, the element body 114 includes a first main surface 114a and a second main surface 114b that are opposed to one another in a stack direction x, a first side surface 114c and a second side surface 114d that are opposed to one another in a width direction y orthogonal or substantially orthogonal to the stack direction x, and a first end surface 114e and a second end surface 114f that are opposed to one another in a length direction z orthogonal or substantially orthogonal to the stack direction x and the width direction y. Corner portions and ridge portions of the element body 114 are preferably rounded. The corner portions are each a portion at which three adjacent surfaces of the element body intersect with one another. The ridge portions are each a portion at which two adjacent surfaces of the element body intersect with one another.

Protrusions and recesses may be provided at a portion or the entirety of each of the first main surface 114a and the second main surface 114b, the first side surface 114c and the second side surface 114d, and the first end surface 114e and the second end surface 114f.

The second main surface 114b of the element body 114 is located on the side near a mounting surface of a mounting substrate on which the ceramic electronic component 110 is to be mounted.

The ceramic layers 116 include an outer-layer portion 116a including a plurality of ceramic layers 116, and an inner-layer portion 116b including a single ceramic layer 116 or a plurality of ceramic layers 116. The outer-layer portion 116a is located on the sides near the first main surface 114a and the second main surface 114b. The outer-layer portion 116a is a ceramic layer 116 located between the first main surface 114a and the inner electrode layer 118 that is the closest to the first main surface 114a, and is a ceramic layer 116 located between the second main surface 114b and the inner electrode layer 118 that is the closest to the second main surface 114b. The region sandwiched by both the outer-layer portions 116a is the inner-layer portion 116b.

The ceramic layers 116 may preferably be made of a dielectric material. The dielectric material may be dielectric ceramics including, for example, $BaTiO_3$, $CaTiO_3$, $SrTiO_3$, or $CaZrO_3$, as a main component. When the dielectric material is included as a main component, a component having less content than that of a Mn compound, and a Fe compound, a Cr compound, a Co compound, or a Ni compound may be added in accordance with the desired characteristics of the electronic component body 112.

When piezoelectric ceramics are used for the element body 114, the electronic component body defines and functions as a ceramic piezoelectric element. A specific example of the material of piezoelectric ceramics may be, for example, a PZT-based ceramic material.

When semiconductor ceramics is used for the element body 114, the electronic component body defines and functions as a thermistor element. A specific example of the semiconductor ceramic material may be, for example, a spinel-based ceramic material.

When magnetic ceramics is used for the element body 114, the electronic component body defines and functions as an inductor element. Also, when the element body 114 defines and functions as an inductor element, the inner electrode layer 118 is a coil-shaped or substantially coil-shaped conductor. A specific example of the magnetic ceramic material may be, for example, a ferrite ceramic material.

The thickness of each ceramic layer 116 after firing is preferably in a range from about 0.5 μm to about 80 μm, for example.

As illustrated in FIGS. 8 and 9, the element body 114 includes, as the plurality of inner electrode layers 118, a plurality of quadrangular or substantially quadrangular first inner electrode layers 118a and a plurality of quadrangular or substantially quadrangular second inner electrode layers 118b. The plurality of first inner electrode layers 118a and the plurality of second inner electrode layers 118b are embedded and alternately provided at regular intervals in the stack direction x of the element body 114.

Each of electrode surfaces of the first inner electrode layers 118a and the second inner electrode layers 118b is perpendicular or substantially perpendicular to a direction in which the first metal terminal 140a and the second metal terminal 140b extend, and are parallel or substantially parallel to the mounting surface.

The first inner electrode layers 118a each include a first extended electrode portion 120a that extends to the first end surface 114e of the element body 114, on one end side of the first inner electrode layer 118a. The second inner electrode layers 118b each include a second extended electrode portion 120b that extends to the second end surface 114f of the element body 114, on one end side of the first inner electrode layer 118b. Specifically, the first extended electrode portion 120a on the one end side of the first inner electrode layer 118a is exposed from the first end surface 114e of the element body 114. Also, the second extended electrode portion 120b on the one end side of the second inner electrode layer 118b is exposed from the second end surface 114f of the element body 114.

The inner electrode layers 118 may be parallel or substantially parallel to the mounting surface, or perpendicular or substantially perpendicular to the mounting surface.

The element body 114 includes, in the inner-layer portion 116b of the ceramic layer 116, a counter electrode portion 122a in which the first inner electrode layer 118a and the second inner electrode layer 118b face one another. Also, the element body 114 includes side portions (hereinafter, referred to as "W gaps") 122b provided between one end in the width direction y of the counter electrode portion 122a and the first side surface 114c, and between the other end in the width direction y of the counter electrode portion 122a and the second side surface 114d. Further, the element body 114 includes end portions (hereinafter, referred to as "L gaps") 122c provided between an end portion of the first inner electrode layer 118a on the side opposite to the first extended electrode portion 120a and the second end surface 114f, and between an end portion of the second inner electrode layer 118b on the side opposite to the second extended electrode portion 120b and the first end surface 114e.

The inner electrode layers 118 each preferably include, for example, a metal selected from Ni, Cu, Ag, Pd, and Au, or an alloy, such as an Ag—Pd alloy including at least one of the metals. The inner electrode layer 118 may further include dielectric particles made of the same or substantially the same composition of ceramics included in the ceramic layer 116.

The thickness of the inner electrode layer 118 is preferably in a range from about 0.2 μm to about 2.0 μm, for example.

Outer electrodes 130 are provided on the first end surface 114e side and the second end surface 114f side of the element body 114. The outer electrodes 130 include a first outer electrode 130a and a second outer electrode 130b.

The first outer electrode 130a is provided on a surface of the first end surface 114e of the element body 114, and extends from the first end surface 114e to cover a portion of the first main surface 114a, a portion of the second main surface 114b, a portion of the first side surface 114c, and a portion of the second side surface 114d. In this case, the first outer electrode 130a is electrically connected to the first extended electrode portion 120a of the first inner electrode layer 118a. Alternatively, the first outer electrode 130a may be provided on only the surface of the first end surface 114e of the element body 114.

The second outer electrode 130b is provided on a surface of the second end surface 114f of the element body 114, and extends from the second end surface 114f to cover a portion of the first main surface 114a, a portion of the second main surface 114b, a portion of the first side surface 114c, and a portion of the second side surface 114d. In this case, the second outer electrode 130b is electrically connected to the second extended electrode portion 120b of the second inner electrode layer 118b. Alternatively, the second outer electrode 130b may be provided on the surface of the second end surface 114f of the element body 114.

In the element body 114, since the first inner electrode layer 118a faces the second inner electrode layer 118b via the ceramic layer 116 in the counter electrode portion 122a, an electrostatic capacitance is provided. Thus, an electrostatic capacitance is able to be provided between the first outer electrode 130a to which the first inner electrode layer 118a is connected and the second outer electrode 130b to which the second inner electrode layer 118b is connected. The electronic component body having such a structure defines and functions as a capacitor element.

As illustrated in FIGS. 8 and 9, the first outer electrode 130a includes, in the order from the element body 114 side, a first underlying electrode layer 132a, and a first plated layer 134a provided on a surface of the first underlying electrode layer 132a. Similarly, the second outer electrode 130b includes, in the order from the element body 114 side, a second underlying electrode layer 132b, and a second plated layer 134b provided on a surface of the second underlying electrode layer 132b.

The first underlying electrode layer 132a is provided on the surface of the first end surface 114e of the element body 114, and extends from the first end surface 114e to cover a portion of the first main surface 114a, a portion of the second main surface 114b, a portion of the first side surface 114c, and a portion of the second side surface 114d. Alternatively, the first underlying electrode layer 132a may be provided on only the surface of the first end surface 114e of the element body 114.

The second underlying electrode layer 132b is provided on the surface of the second end surface 114f of the element body 114, and extends from the second end surface 114f to cover a portion of the first main surface 114a, a portion of the second main surface 114b, a portion of the first side surface 114c, and a portion of the second side surface 114d. Alternatively, the second underlying electrode layer 132b may be provided on only the surface of the second end surface 114f of the element body 114.

The first underlying electrode layer 132a and the second underlying electrode layer 132b each preferably include at least one selected from a baked layer, a thin-film layer, and other layers, for example. The material and structure of the first underlying electrode layer 132a and the second underlying electrode layer 132b are the same or substantially the same as those of the first underlying electrode layer 32a and the second underlying electrode layer 32b, and thus, the description thereof is omitted.

The first plated layer 134a covers the first underlying electrode layer 132a. Specifically, the first plated layer 134a is preferably provided on the first end surface 114e on the surface of the first underlying electrode layer 132a, and preferably extends to the first main surface 114a and the second main surface 114b, and the first side surface 114c and the second side surface 114d on the surface of the first underlying electrode layer 132a. If the first underlying electrode layer 132a is provided on only the surface of the first end surface 114e of the element body 114, the first plated layer 134a may cover only the surface of the first underlying electrode layer 132a.

Similarly, the second plated layer 134b covers the second underlying electrode layer 132b. Specifically, the second plated layer 134b is preferably provided on the second end surface 114f on the surface of the second underlying electrode layer 132b, and preferably extends to the first main surface 114a and the second main surface 114b, and the first side surface 114c and the second side surface 114d on the surface of the second underlying electrode layer 132b. If the second underlying electrode layer 132b is provided on only the surface of the second end surface 114f of the element body 114, the second plated layer 134b may cover only the surface of the second underlying electrode layer 132b.

The material and structure of the first plated layer 134a and the second plated layer 134b are the same or substantially the same as those of the first plated layer 34a and the second plated layer 34b, and thus, the description thereof is omitted.

Next, a case in which the first underlying electrode layer 132a and the second underlying electrode layer 132b are made of plated electrodes is described. The first underlying electrode layer 132a is defined by a plated layer that is directly connected to the first inner electrode layer 118a, is directly disposed on the surface of the first end surface 114e of the element body 114, and extends from the first end surface 114e to cover a portion of the first main surface 114a, a portion of the second main surface 114b, a portion of the first side surface 114c, and a portion of the second side surface 114d.

The second underlying electrode layer 132b is defined by a plated layer that is directly connected to the second inner electrode layer 118b, is directly disposed on the surface of the second end surface 114f of the element body 114, and extends from the second end surface 114f to cover a portion of the first main surface 114a, a portion of the second main surface 114b, a portion of the first side surface 114c, and a portion of the second side surface 114d.

To enable the first underlying electrode layer 132a and the second underlying electrode layer 132b to be plated layers, a catalyst is provided on the element body 114 for preprocessing.

The first underlying electrode layer 132a defined by the plated layer is preferably covered with the first plated layer 134a. Similarly, the second underlying electrode layer 132b defined by the plated layer is preferably covered with the second plated layer 134b.

In this case, the material and structure of the first underlying electrode layer 132a and the second underlying electrode layer 132b, and the material and structure of the first plated layer 134a and the second plated layer 134b are preferably the same or substantially the same as those of the first underlying electrode layer 32a and the second underlying electrode layer 32b, and those of the first plated layer 34a and the second plated layer 34b. Thus, the description thereof is omitted.

The first plated layer 134a and the second plated layer 134b are provided as necessary. The first outer electrode 130a may include only the first underlying electrode layer 132a, and the second outer electrode 130b may include only the second underlying electrode layer 132b. Alternatively, the first plated layer 134a and the second plated layer 134b may be provided as the outermost layers of the first outer electrode 130a and the second outer electrode 130b, or another plated layer may be provided on the first plated layer 134a or the second plated layer 134b.

Metal terminals include the first metal terminal 140a and the second metal terminal 140b.

The metal terminals are provided to mount the ceramic electronic component 110 on the mounting substrate.

The first metal terminal 140a is preferably, for example, a plate-shaped or substantially plate-shaped lead frame. The first metal terminal 140a defined by the plate-shaped or substantially plate-shaped lead frame includes one main surface that is connected to the first outer electrode 130a, the other main surface that is opposed to the one main surface, and a peripheral surface that defines a thickness between the one main surface and the other main surface.

Similarly, the second metal terminal 140b is preferably, for example, a plate-shaped or substantially plate-shaped lead frame. The second metal terminal 140b defined by the plate-shaped or substantially plate-shaped lead frame includes one main surface that is connected to the second outer electrode 130b, the other main surface that is opposed to the one main surface, and a peripheral surface that defines a thickness between the one main surface and the other main surface.

The first metal terminal 140a is connected to the first outer electrode 130a of the electronic component body 112 via the first joint material 160a.

The second metal terminal 140b is connected to the second outer electrode 130b of the electronic component body 112 via the second joint material 160b.

The first metal terminal 140a includes a first terminal joint portion 142 that is connected to the first end surface 114e of the element body 114, a first extension portion 144 that is connected to the first terminal joint portion 142 and that defines a gap between the second main surface 114b of the electronic component body 112 and the mounting surface, in a direction toward the mounting surface, and a first mount portion 146 that is connected to the first extension portion 144 and that extends from the first extension portion 144 in a direction in which the first end surface 114e and the second end surface 114f are coupled to one another.

The second metal terminal 140b includes a second terminal joint portion 152 that is connected to the second end surface 114f of the element body 114, a second extension portion 154 that is connected to the second terminal joint portion 152 and that defines a gap between the second main surface 114b of the electronic component body 112 and the mounting surface, in the direction toward the mounting surface, and a second mount portion 156 that is connected to the second extension portion 154 and that extends from the second extension portion 154 in a direction in which the first end surface 114e and the second end surface 114f are coupled to one another.

The first terminal joint portion 142 of the first metal terminal 140a is a portion that is connected to the first outer electrode 130a on the side near the first end surface 114e of the element body 114 via the first joint material 160a, and preferably has a quadrangular or substantially quadrangular plate shape having a size the same or substantially the same as the size of the electronic component body 112 in the width direction y on the first end surface 114e side. The first terminal joint portion 142 of the first metal terminal 140a may include a notch.

The second terminal joint portion 152 of the second metal terminal 140b is a portion that is connected to the second outer electrode 130b on the side near the second end surface 114f of the element body 114 via the second joint material 160b, and preferably has a quadrangular or substantially quadrangular plate shape having a size the same or substantially the same as the size of the electronic component body 112 in the width direction y on the second end surface 114f side. The second terminal joint portion 152 of the second metal terminal 140b may include a notch.

The first extension portion 144 includes a first extension-portion-defining member 144a that is connected to the first terminal joint portion 142 and that extends in a direction parallel or substantially parallel to the second main surface 114b, and a second extension-portion-defining member 144b that is connected to the first extension-portion-defining member 144a and that extends in the direction toward the mounting surface. The first extension portion 144 defines a gap between the second main surface 114b of the electronic component body 112 and the mounting surface of the mounting substrate.

The second extension portion 154 includes a sixth extension-portion-defining member 154a that is connected to the second terminal joint portion 152 and that extends in the direction parallel or substantially parallel to the second main surface 114b, and a seventh extension-portion-defining member 154b that is connected to the sixth extension-portion-defining member 154a and that extends in the direction toward the mounting surface. The second extension portion 154 defines a gap between the second main surface 114b of the electronic component body 112 and the mounting surface of the mounting substrate.

By providing the first extension portion 144 of the first metal terminal 140a, and the second extension portion 154 of the second metal terminal 140b, elastic deformation of the first metal terminal 140a and the second metal terminal 140b is able to absorb a mechanical strain that is generated in the ceramic layer 116 when an alternating voltage is applied.

The first extension-portion-defining member 144a of the first metal terminal 140a is connected to the first terminal joint portion 142 and extends in the direction parallel or substantially parallel to the second main surface 114b of the element body 114. The first extension-portion-defining member 144a of the first metal terminal 140a preferably has, for example, a rectangular or substantially rectangular plate shape.

The sixth extension-portion-defining member 154a of the second metal terminal 140b is connected to the second terminal joint portion 152 and extends in the direction parallel or substantially parallel to the second main surface 114b of the element body 114. The sixth extension-portion-defining member 154a of the second metal terminal 140b preferably has, for example, a rectangular or substantially rectangular plate shape.

The second extension-portion-defining member 144b of the first metal terminal 140a is connected to the first extension-portion-defining member 144a, and extends in the direction toward the mounting surface. Specifically, the second extension-portion-defining member 144b bends at a terminal end of the first extension-portion-defining member 144a, and extends in the direction toward the mounting surface. The angle of the bending portion may be gentle, or steep to be at a substantially right angle, for example.

The seventh extension-portion-defining member 154b of the second metal terminal 140b is connected to the sixth extension-portion-defining member 154a, and extends in the direction toward the mounting surface. Specifically, the seventh extension-portion-defining member 154b bends at a terminal end of the sixth extension-portion-defining member 154a, and extends in the direction toward the mounting surface. The angle of the bending portion may be gentle, or steep to be at a substantially right angle, for example.

The first mount portion 146 of the first metal terminal 140a is connected to the second extension-portion-defining member 144b of the first metal terminal 140a and extends from the first extension portion 144 in the direction in which the first end surface 114e and the second end surface 114f are coupled to one another toward a side opposite to the electronic component body 112. Specifically, the first mount portion 146 bends at a terminal end of the second extension-portion-defining member 144b, and extends in parallel or substantially parallel to the mounting surface.

The shape of the first mount portion 146 is preferably triangular or substantially triangular in plan view. The first mount portion 146 includes a first protrusion 146a that is sufficiently pressed and deformed in a circular or substantially circular shape and protrudes toward the mounting surface of the mounting substrate. A recess on the side opposite to the mounting surface of the mounting substrate at the first protrusion 146a defines and functions as a first recess 146b.

The shape in plan view of the first mount portion 146 is not limited to the triangular or substantially triangular shape, and may be a quadrangular or substantially quadrangular shape.

The second mount portion 156 of the second metal terminal 140b is connected to the seventh extension-portion-defining member 154b of the second metal terminal 140b and extends from the second extension portion 154 in the direction in which the first end surface 114e and the second end surface 114f are coupled to one another toward a side opposite to the electronic component body 112. Specifically, the second mount portion 156 bends at a terminal end of the seventh extension-portion-defining member 154b, and extends in parallel or substantially parallel to the mounting surface.

The shape of the second mount portion 156 is preferably triangular or substantially triangular in plan view. The second mount portion 156 includes a second protrusion 156a that is sufficiently pressed and deformed in a circular or substantially circular shape and protrudes toward the mounting surface of the mounting substrate. A recess on the side opposite to the mounting surface of the mounting substrate at the second protrusion 156a defines and functions as a second recess 156b.

The shape in plan view of the second mount portion 156 is not limited to the triangular or substantially triangular shape, and may be a quadrangular or substantially quadrangular shape.

The first protrusion 146a is preferably provided on one of end sides of the first mount portion 146 in a direction orthogonal or substantially orthogonal to a direction in which the metal terminal extends. The second protrusion 156a is preferably provided on one of end sides of the second mount portion 156 in a direction orthogonal or substantially orthogonal to a direction in which the metal terminal extends. At this time, the first protrusion 146a and the second protrusion 156a are preferably located at end portions on the same side in the direction orthogonal or substantially orthogonal to the direction in which the metal terminals extend. In particular, the first protrusion 146a and the second protrusion 156a are preferably located on the side opposite to the oblique edges that define the first mount portion 146 and the second mount portion 156.

Also, the first mount portion 146 of the first metal terminal 140a, and the second mount portion 156 of the second metal terminal 140b have small contact areas with respect to the mounting substrate. Welding is able to be performed by merely irradiating, with laser beams, the first recess 146b on the side opposite to the mounting surface of the mounting substrate at the first protrusion 146a, and the second recess 156b on the side opposite to the mounting surface of the mounting substrate at the second protrusion 156a. Thus, the welding time is decreased.

The first protrusion 146a and the second protrusion 156a may be angular or rounded.

In the ceramic electronic component 110 according to the present preferred embodiment, the height h of each of the first protrusion 146a and the second protrusion 156a is preferably in a range from about 0.1 mm to about 0.5 mm, for example, from a bottom surface of the first mount portion 146 or the second mount portion 156. Alternatively, the height h of each of the first protrusion 146a and the second protrusion 156a is preferably in a range from about 1% to about 6%, for example, of the distance between the first protrusion 146a and the second protrusion 156a. Accordingly, undulations of the board surface and low coplanarity of the electronic component are absorbed, and the protrusions securely contact the board. In addition, irradiation with laser beams is reliably provided.

The first metal terminal 140a and the second metal terminal 140b each include a terminal body, and a plated film provided on a surface of the terminal body. The materials and structures of the terminal body and the plated film of each of the first metal terminal 140a and the second metal terminal 140b are the same or substantially the same as those of the first metal terminal 40a and the second metal terminal 40b, and thus, the description thereof is omitted.

The plated film may not be provided on at least a peripheral surface 149 of the first extension portion 144 and the first mount portion 146 of the first metal terminal 140a, and a peripheral surface 151 of the second extension portion 154 and the second mount portion 156 of the second metal terminal 140b.

The outer resin material 170 covers the element body 114, the first outer electrode 130a, the second outer electrode 130b, a portion of the first metal terminal 140a, a portion of the second metal terminal 140b, the first joint material 160a between the first outer electrode 130a and the first metal terminal 140a, and the second joint material 160b between the second outer electrode 130b and the second metal terminal 140b.

The outer resin material 170 preferably has a rectangular or substantially rectangular-parallelepiped shape. The outer resin material 170 includes a first main surface 170a and a second main surface 170b that respectively face the first main surface 114a and the second main surface 114b of the element body 114, a first side surface 170c and a second side surface 170d that are orthogonal or substantially orthogonal to the first main surface 170a and the second main surface 170b, and that extend in the length direction z, and a first end surface 170e and a second end surface 170f that are orthogonal or substantially orthogonal to the first main surface 170a, the second main surface 170b, the first side surface 170c, and the second side surface 170d. The shapes of the corner portions of the outer resin material 170 are not particularly limited and may be rounded.

The first main surface 170a and the second main surface 170b of the outer resin material 170 may preferably have planar or substantially planar shapes.

The material of the outer resin material 170 is the same or substantially the same as that of the outer resin material 70, and thus, the description thereof is omitted.

A protruding portion 172 is provided at a surface of the outer resin material 170 on the mounting surface side (the second main surface 170b side). The protruding portion 172, together with the first protrusion 146a of the first metal terminal 140a and the second protrusion 156a of the second metal terminal 140b, is disposed such that the vertices of the protruding portion and protrusions contact the mounting surface of the mounting substrate. With this configuration according to the present preferred embodiment, point contact or surface contact in a small area is provided at each of three positions on the mounting surface of the mounting substrate. Accordingly, even when the mounting substrate is warped, or even when the connection positions are not in one plane due to a step, the contact state at the three positions can be securely provided, and mounting by welding is able to be reliably performed.

The height of the protruding portion 172 is not particularly limited, and is adjusted such that the vertex of the protruding portion 172, together with the vertices of the first protrusion 146a of the first metal terminal 140a and the second protrusion 156a of the second metal terminal 140b, contacts the mounting surface of the mounting substrate.

The position at which the protruding portion 172 is provided is determined so that the first protrusion 146a, the second protrusion 156a, and the protruding portion 172 are not located in one straight line. The protruding portion 172 is provided at the surface of the outer resin material 170 on the mounting surface side (the second main surface 170b side) on the side opposite to the side on which the first protrusion 146a of the first metal terminal 140a and the second protrusion 156a of the second metal terminal 140b are provided. In particular, the protruding portion 172 is preferably located at an end portion of the surface of the outer resin material 170 on the mounting surface side (the second main surface 170b side), at a position near the center in the direction in which the metal terminals extend. Accordingly, the first protrusion 146a, the second protrusion 156a, and the protruding portion 172 contact the mounting surface of the mounting substrate more stably at three support points.

The first outer electrode 130a and the first metal terminal 140a are connected by the first joint material 160a. The second outer electrode 130b and the second metal terminal 140b are connected by the second joint material 160b. The material of the first joint material 160a and the second joint material 160b is the same or substantially the same as that of the first joint material 60a and the second joint material 60b, and thus, the description thereof is omitted.

A dimension L is a dimension of the ceramic electronic component 110 in the length direction z (in which the metal terminals extend), the ceramic electronic component 110 including the outer resin material 170, the first metal terminal 140a, and the second metal terminal 140b, a dimension T is a dimension of the ceramic electronic component 110 in the stack direction x of the outer resin material 170 (a direction in which the first main surface 170a and the second main surface 170b of the outer resin material 170 are coupled to one another), and a dimension W is a dimension of the ceramic electronic component 110 in the width direction y of the outer resin material 170 (a direction in which the first side surface 170c and the second side surface 170d of the outer resin material 170 are coupled to one another).

The dimensions of the ceramic electronic component 110 are not particularly limited. However, preferably, the dimension L in the length direction z is in a range from about 2 mm to about 40 mm, the dimension W in the width direction y is in a range from about 1.2 mm to about 40 mm, and the dimension T in the stack direction x is in a range from about 1.2 mm to about 10 mm, for example.

Next, a mounting structure for a ceramic electronic component 110 according to a preferred embodiment of the present invention is described.

As illustrated in FIG. 11, the ceramic electronic component 110 is mounted on a mounting substrate 80. Specifically, the ceramic electronic component 110 is disposed on a mounting surface of the mounting substrate 80, and is joined to the mounting substrate 80 by welding at the first protrusion 146a of the first mount portion 146 of the first metal terminal 140a, and the second protrusion 156a of the second mount portion 156 of the second metal terminal 140b.

The joining by welding is preferably joining by welding using laser beams L. That is, mounting by welding is performed by irradiating, with the laser beams L, the first recess 146*b* on the side opposite to the mounting surface of the mounting substrate 80 at the position of the first protrusion 146*a*, and the second recess 156*b* on the side opposite to the mounting surface of the mounting substrate 80 at the position of the second protrusion 156*a*.

With the ceramic electronic component 110 according to the present preferred embodiment, since the first protrusion 146*a* of the first mount portion 146, the second protrusion 156*a* of the second mount portion 156, and the protruding portion 172 of the outer resin material 170 are provided, the ceramic electronic component 110 contacts the mounting surface of the mounting substrate 80 at three positions, by point contact or surface contact in small areas. Accordingly, even when the mounting substrate 80 is warped, or even when the connection positions are not in one plane due to a step, the contact with the mounting substrate 80 at the three positions is securely provided, and mounting by laser welding is reliably performed.

With the mounting structure for the ceramic electronic component 110 according to the present preferred embodiment, the vertices of the first protrusion 146*a* of the first metal terminal 140*a*, the second protrusion 156*a* of the second metal terminal 140*b*, and the protruding portion 172 of the outer resin material 170 are in contact with the corresponding mounting surfaces of the mounting substrate 80. The contact area is small, and mounting by welding is performed by irradiating, with the laser beams L, the portions with the small areas of the first recess 146*b* and the second recess 156*b*. Thus, mounting by welding is easily performed in a short period of time.

Next, a preferred embodiment of a method of manufacturing the ceramic electronic component according to the second preferred embodiment having the above-described configuration is described, using the ceramic electronic component 110 as an example.

First, a ceramic green sheet, inner-electrode conductive paste for forming the inner electrode layer 118, and an outer-electrode conductive paste for forming the outer electrode 130 are prepared. The ceramic green sheet, the inner-electrode conductive paste, and the outer-electrode conductive paste preferably include an organic binder and a solvent. A known organic binder and a known organic solvent may be used.

For example, the inner-electrode conductive paste is applied in a predetermined pattern to the ceramic green sheet. Thus, an inner-electrode pattern is formed on the ceramic green sheet. The inner-electrode conductive paste may be applied by a known method, such as screen printing or gravure printing, for example.

Then, a predetermined number of outer-layer ceramic green sheets on which the inner-electrode pattern is not applied by printing are stacked, the ceramic green sheets on which the inner-electrode patterns are applied by printing are sequentially stacked thereon, a predetermined number of outer-layer ceramic green sheets are stacked thereon, and thus, an element body sheet is fabricated. Then, the element body sheet is pressure bonded in the stack direction x by isostatic press or another method, and thus, an element body block is fabricated.

Then, the element body block is cut into a predetermined shape and dimension, and a raw element body chip is cut out. At this time, corner portions and ridge portions of the raw element body may be rounded, for example, by barrel finishing. Then, the cut out, raw element body chip is fired, and thus, the element body 114 is generated. The firing temperature of the raw element body chip is preferably in a range from about 900° C. to about 1300° C., for example, depending on the material of the ceramics or the material of the inner-electrode conductive paste.

Next, to form the baked layer of the first outer electrode 130*a*, for example, the outer-electrode conductive paste is applied to exposed portions of the first extended electrode portions 120*a* of the first inner electrode layers 118*a* exposed from the first end surface 114*e* of the element body 114 and baked. Similarly, to form the baked layer of the second outer electrode 130*b*, for example, the outer-electrode conductive paste is applied to exposed portions of the second extended electrode portions 120*b* of the second inner electrode layers 118*b* exposed from the second end surface 114*f* of the element body 114 and baked. Thus, the baked layers are formed. At this time, the baking temperature is preferably in a range from about 700° C. to about 900° C., for example. As necessary, at least one plated layer is formed on a surface of each baked layer, the outer electrode 130 is formed, and the electronic component body 112 is manufactured.

Alternatively, for the outer electrodes 130, instead of forming the baked layer, a portion of a surface of the element body 114 on the first end surface 114*e* side may be plated and thus an underlying plated film may be formed on the exposed portions of the first extended electrode portions 120*a* of the first inner electrode layers 118*a* exposed from the first end surface 114*e*. Similarly, a portion of a surface of the element body 114 on the second end surface 114*f* side is plated and thus an underlying plated film may be formed on the exposed portions of the second extended electrode portions 120*b* of the second inner electrode layers 118*b* exposed from the second end surface 114*f*.

The plating may be either of electrolytic plating and non-electrolytic plating. Non-electrolytic plating requires pre-processing with a catalyst to increase the plating precipitation speed, and the process may be complicated. Accordingly, electrolytic plating is preferably used. For the plating method, barrel plating is preferably used.

If a partial conductor of the outer electrode 130 is formed on the surfaces of the first end surface 114*e* and the second end surface 114*f* of the element body 114, a surface conductor pattern may be applied by printing on a ceramic green sheet of the outermost layer in advance, and may be fired simultaneously with the element body 114. Alternatively, a surface conductor may be applied by printing on the first end surface 114*e* and the second end surface 114*f* of the fired element body 114 and may be baked. Further, an upper plated layer is formed on a surface of the underlying plated layer, as necessary.

In this manner, plated electrodes are directly formed on the first end surface 114*e* and the second end surface 114*f* of the element body 114.

A step of attaching the metal terminals in the method of manufacturing the ceramic electronic component according to the present preferred embodiment is described.

First, the first metal terminal 140*a* and the second metal terminal 140*b* are prepared.

The first metal terminal 140*a* and the second metal terminal 140*b* are shaped by bending.

Then, the first joint material (solder) 160*a* is applied to a surface of the first outer electrode 130*a* on the first end surface 114*e* of the electronic component body 112 or a surface of the first terminal joint portion 142 of the prepared first metal terminal 140*a*. Then, by performing reflowing in a state in which the first outer electrode 130*a* of the electronic component body 112 is joined to the first terminal joint portion 142 of the first metal terminal 140a, the first metal terminal 140a is attached to the first outer electrode 130a of the electronic component body 112. Similarly, the second joint material (solder) 160b is applied to a surface of the second outer electrode 130b on the second end surface 114f of the electronic component body 112 or a surface of the second terminal joint portion 152 of the prepared second metal terminal 140b. Then, by performing reflowing in a state in which the second outer electrode 130b of the electronic component body 112 is joined to the second terminal joint portion 152 of the second metal terminal 140b, the second metal terminal 140b is attached to the second outer electrode 130b of the electronic component body 112.

Then, the outer resin material 170 is formed. The outer resin material 170 is preferably formed, for example, by applying liquid or powder silicone-based or epoxy-based resin by dip coating to the electronic component body 112 to which the metal terminals are attached, and hardening the resin. The hardening temperature is preferably in a range from about 150° C. to about 200° C., for example, depending on the material of epoxy resin. The outer resin material 170 may be molded by a method of injection molding engineering plastics or a method of transfer molding engineering plastics, for example. In particular, the outer resin material 170 is preferably made of thermosetting epoxy resin, for example.

Then, after the outer resin material 170 is formed, the metal terminals protruding from the outer resin material 170 are bent along the side surfaces and bottom surface of the outer resin material 170, and the ceramic electronic component 110 illustrated in FIG. 6 is obtained.

Third Preferred Embodiment

Figure 12:
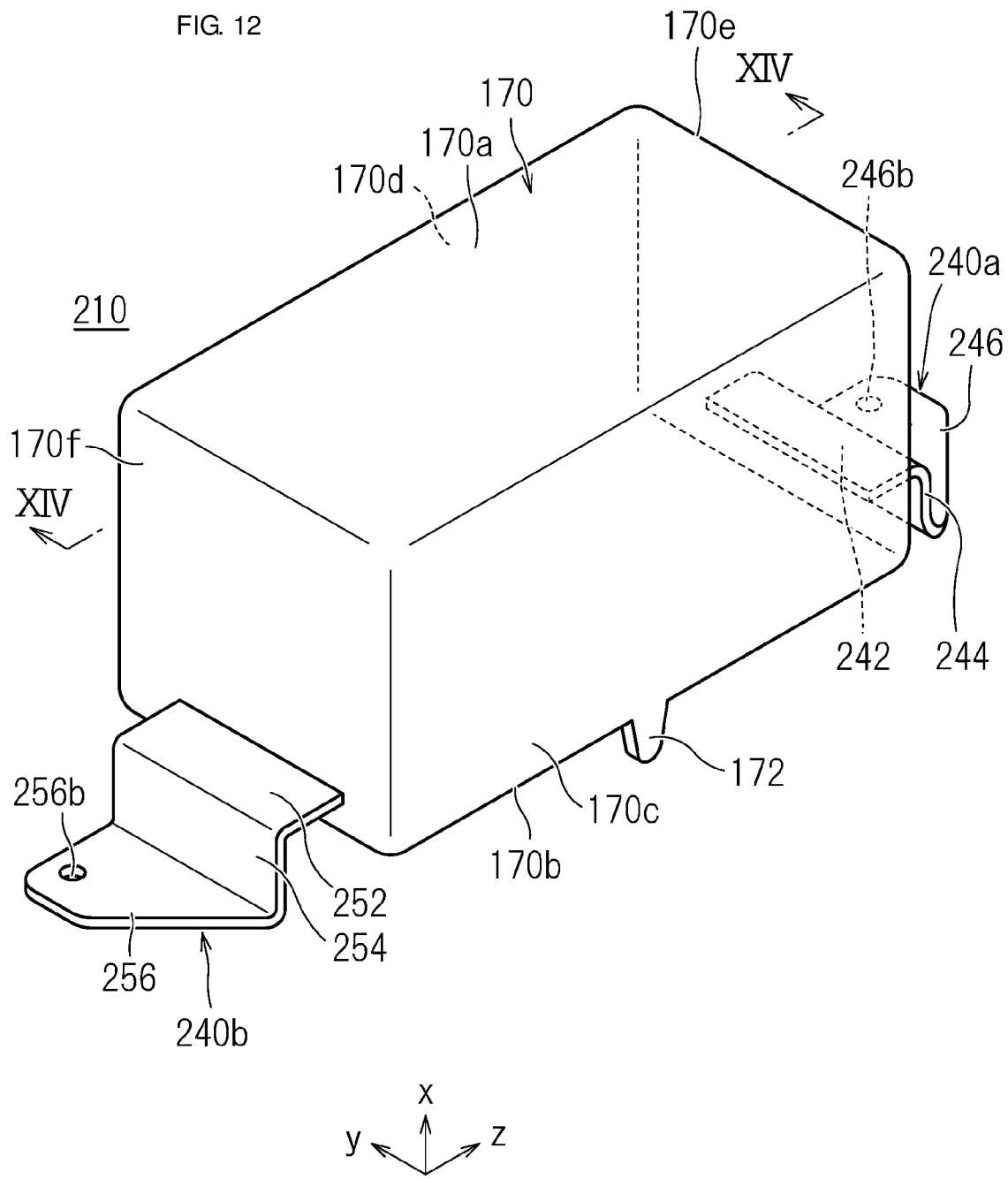
FIG. 12 is an external perspective view illustrating an example of a ceramic electronic component according to a third preferred embodiment of the present invention.
Figure 13:
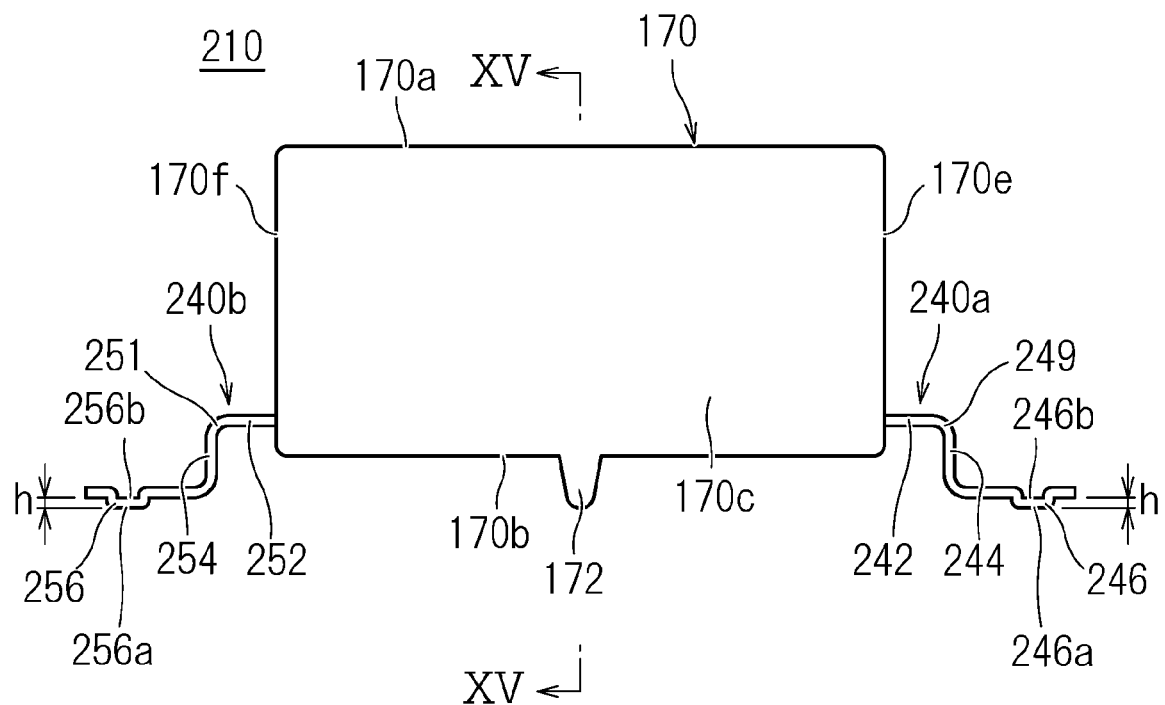
FIG. 13 is a side view of FIG. 12, illustrating the ceramic electronic component according to the third preferred embodiment of the present invention.
Figure 14:
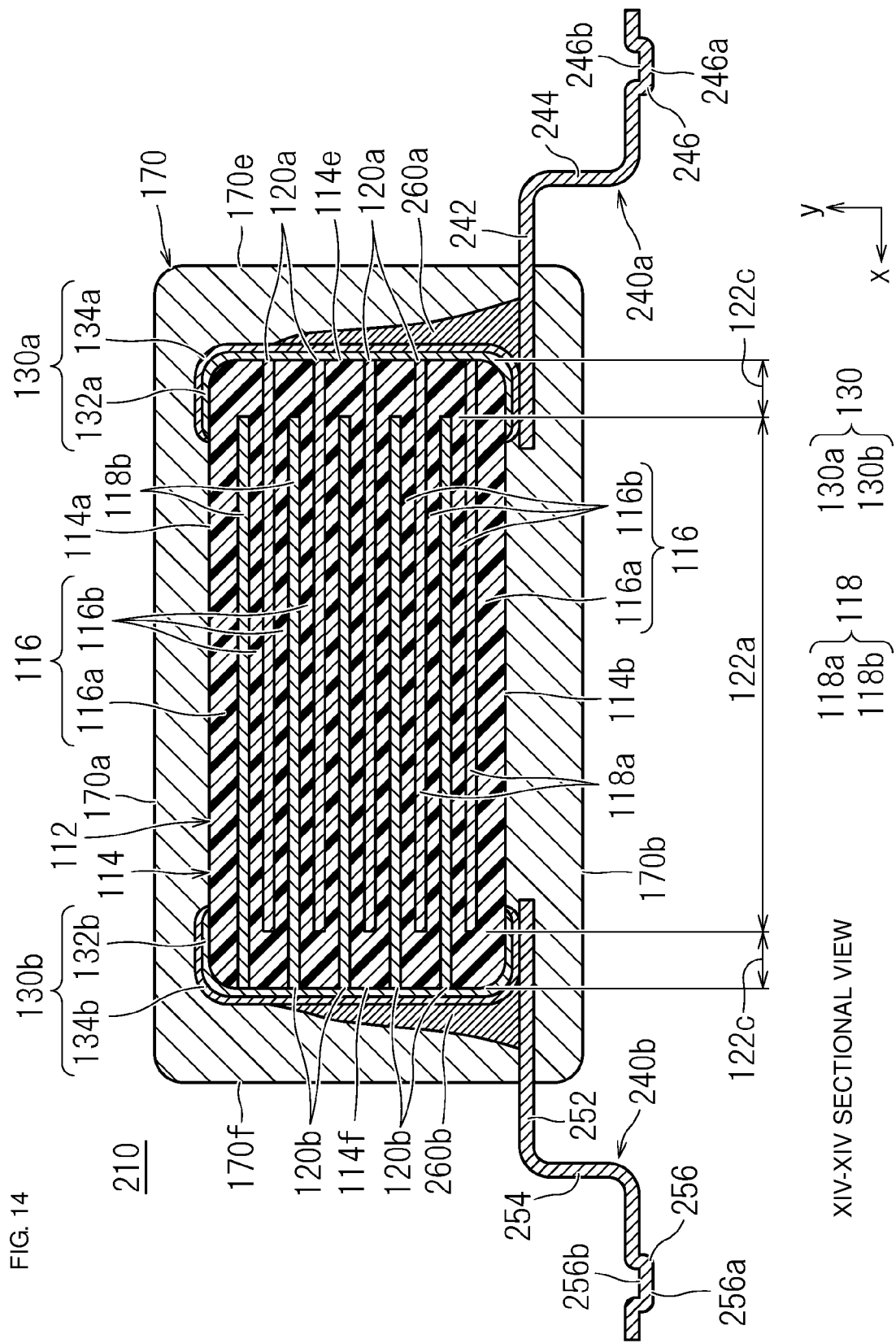
FIG. 14 is a sectional view taken along line XIV-XIV of FIG. 12, illustrating the ceramic electronic component according to the third preferred embodiment of the present invention.
Figure 15:
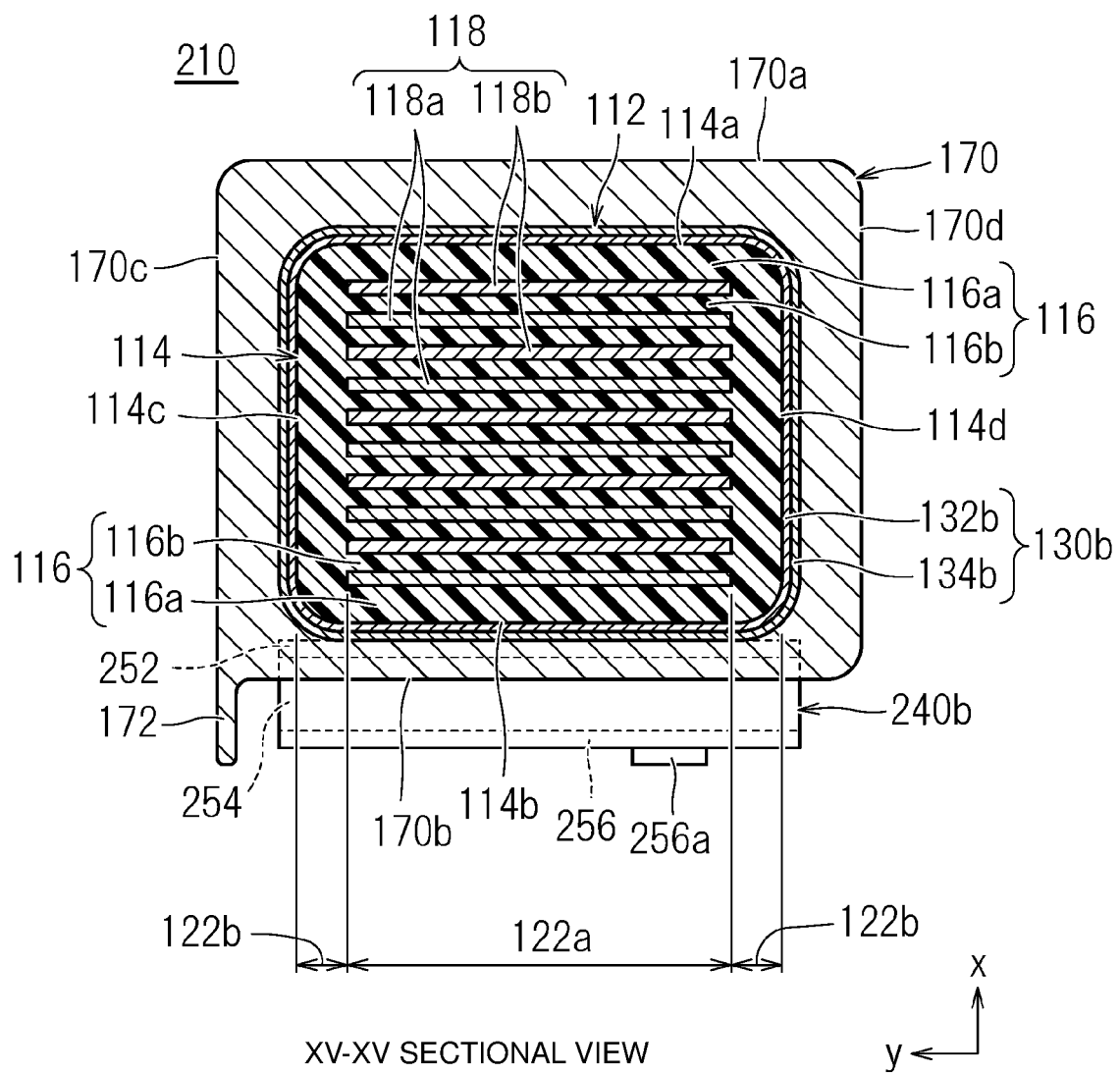
FIG. 15 is a sectional view taken along line XV-XV of FIG. 12, illustrating the ceramic electronic component according to the third preferred embodiment of the present invention.
Figure 16A:
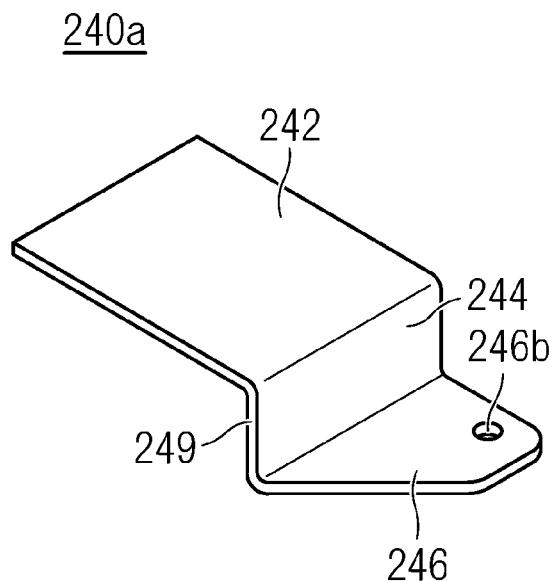
FIGS. 16A and 16B are external perspective views illustrating metal terminals included in the ceramic electronic component according to the third preferred embodiment of the present invention, FIG. 16A illustrating a first metal terminal, FIG. 16B illustrating a second metal terminal.
Figure 16B:
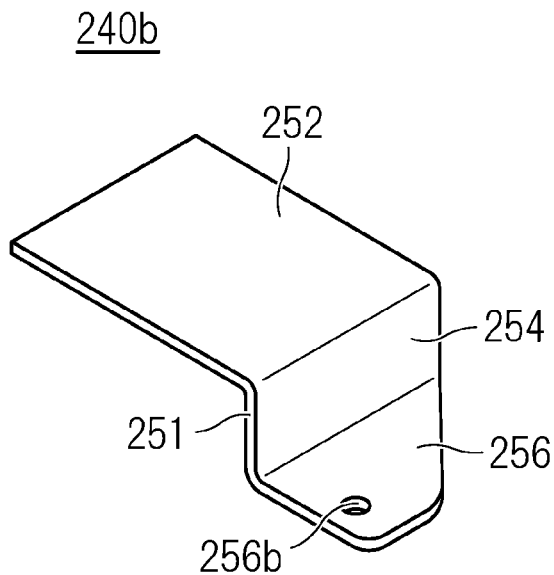
Figure 17:
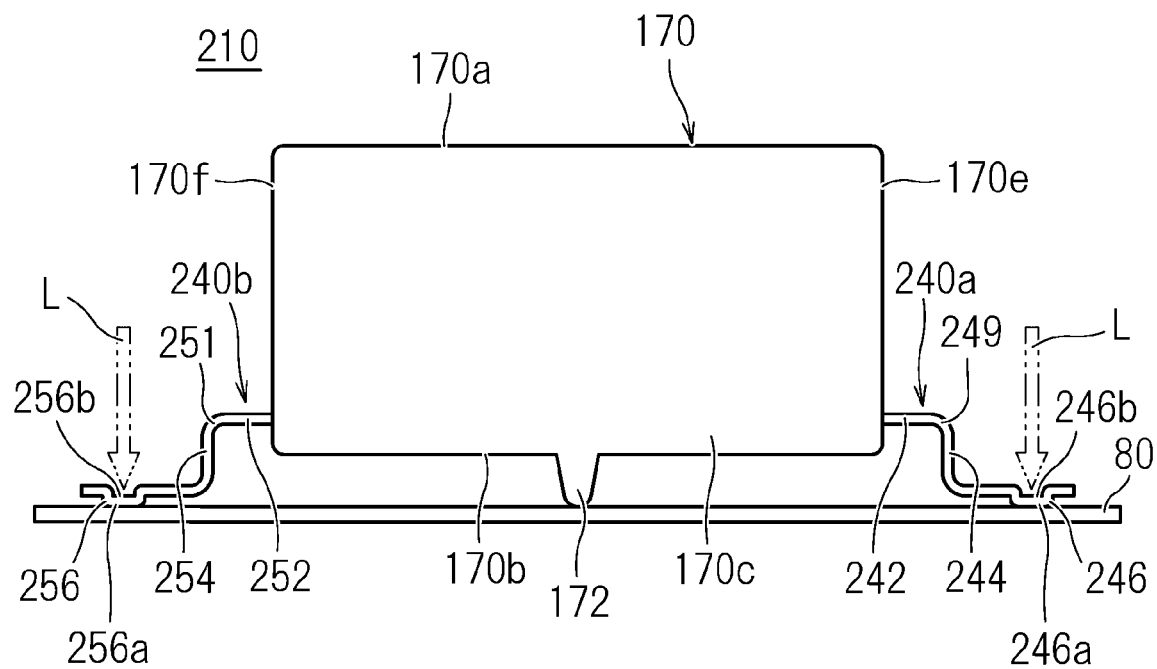
FIG. 17 is a schematic configuration diagram illustrating a state of a mounting structure for the ceramic electronic component according to the third preferred embodiment of the present invention.

A ceramic electronic component according to a third preferred embodiment of the present invention is described. FIG. 12 is an external perspective view illustrating an example of a ceramic electronic component according to the third preferred embodiment of the present invention. FIG. 13 is a side view of FIG. 12, illustrating the ceramic electronic component according to the third preferred embodiment of the present invention. FIG. 14 is a sectional view taken along line XIV-XIV of FIG. 12, illustrating the ceramic electronic component according to the third preferred embodiment of the present invention. FIG. 15 is a sectional view taken along line XV-XV of FIG. 13, illustrating the ceramic electronic component according to the third preferred embodiment of the present invention. FIGS. 16A and 16B are external perspective views illustrating metal terminals included in the ceramic electronic component according to the third preferred embodiment of the present invention, FIG. 16A illustrating a first metal terminal, FIG. 16B illustrating a second metal terminal. FIG. 17 is a schematic configuration diagram illustrating a state of a mounting structure for the ceramic electronic component according to the third preferred embodiment of the present invention. A ceramic electronic component 210 according to the present preferred embodiment has a configuration similar to that of the ceramic electronic component 110 described with reference to FIGS. 6 to 11, except that a first metal terminal 240a and a second metal terminal 240b have configurations different from those of the first metal terminal 140a and the second metal terminal 140b. Thus, the same reference signs are applied to portions that are the same as or similar to that of the ceramic electronic component 110 illustrated in FIGS. 6 to 11, and the description thereof is omitted.

The ceramic electronic component 210 according to the third preferred embodiment includes, for example, an electronic component body 112, and two metal terminals including the first metal terminal 240a and the second metal terminal 240b. The electronic component body 112 is connected to the first metal terminal 240a via a first joint material 260a. The electronic component body 112 is connected to the second metal terminal 240b via a second joint material 260b. Also, the ceramic electronic component 210 includes an outer resin material 170 that covers the electronic component body 112, at least a portion of the first metal terminal 240a, and at least a portion of the second metal terminal 240b.

Metal terminals include the first metal terminal 240a and the second metal terminal 240b.

The metal terminals are provided to mount the ceramic electronic component 210 on the mounting substrate.

The first metal terminal 240a preferably includes, for example, a plate shaped or substantially plate shaped lead frame. The first metal terminal 240a defined by the plate shaped or substantially plate shaped lead frame includes one main surface that is connected to the first outer electrode 130a, the other main surface that is opposed to the one main surface, and a peripheral surface that defines a thickness between the one main surface and the other main surface.

Similarly, the second metal terminal 240b preferably includes, for example, a plate shaped or substantially plate shaped lead frame. The second metal terminal 240b defined by the plate shaped or substantially plate shaped lead frame includes one main surface that is connected to the second outer electrode 130b, the other main surface that is opposed to the one main surface, and a peripheral surface that defines a thickness between the one main surface and the other main surface.

The electronic component body 112 is supported by the first metal terminal 240a and the second metal terminal 240b.

The first metal terminal 240a is connected to the first outer electrode 130a of the electronic component body 112 provided on the second main surface 114b, via the first joint material 260a.

The second metal terminal 240b is connected to the second outer electrode 130b of the electronic component body 112 provided on the second main surface 114b, via the second joint material 260b.

The first metal terminal 240a includes a first terminal joint portion 242 that is connected to the second main surface 114b of the element body 114, a first extension portion 244 that is connected to the first terminal joint portion 242 and that defines a gap between the second main surface 114b of the electronic component body 112 and the mounting surface, in a direction toward the mounting surface, and a first mount portion 246 that is connected to the first extension portion 244 and that extends from the first extension portion 244 in a direction in which the first end surface 114e and the second end surface 114f are coupled to one another.

The second metal terminal 240b includes a second terminal joint portion 252 that is connected to the second main surface 114b of the element body 114, a second extension portion 254 that is connected to the second terminal joint portion 252 and that defines a gap between the second main surface 114b of the electronic component body 112 and the mounting surface, in the direction toward the mounting surface, and a second mount portion 256 that is connected to the second extension portion 254 and that extends from the second extension portion 254 in a direction in which the first end surface 114e and the second end surface 114f are coupled to one another.

The first terminal joint portion 242 of the first metal terminal 240a is connected to the first outer electrode 130a provided on the surface of the second main surface 114b of the element body 114. The first terminal joint portion 242 preferably has a quadrangular or substantially quadrangular plate shape, and is connected to the first outer electrode 130a provided on the surface of the second main surface 114b, via the first joint material 260a.

The first terminal joint portion 242 of the first metal terminal 240a may include a notch or other similar structure.

The second terminal joint portion 252 of the second metal terminal 240b is connected to the second outer electrode 130b provided on the surface of the second main surface 114b of the element body 114. The second terminal joint portion 252 preferably has a quadrangular or substantially quadrangular plate shape, and is connected to the second outer electrode 130b provided on the surface of the second main surface 114b, via the second joint material 260b.

The second terminal joint portion 252 of the second metal terminal 240b may include a notch or other similar structure.

The first extension portion 244 is connected to the first terminal joint portion 242, bends at a terminal end of the first terminal joint portion 242, and is connected to the first mount portion 246. The angle of the bending portion may be gentle, or steep to be at a substantially right angle, for example. The first extension portion 244 defines a gap between the second main surface 114b of the electronic component body 112 and the mounting surface of the mounting substrate.

The second extension portion 254 is connected to the second terminal joint portion 252, bends at a terminal end of the second terminal joint portion 252, and is connected to the second mount portion 256. The angle of the bending portion may be gentle, or steep to be at a substantially right angle, for example. The second extension portion 254 defines a gap between the second main surface 114b of the electronic component body 112 and the mounting surface of the mounting substrate.

By providing the first extension portion 244 of the first metal terminal 240a, and the second extension portion 254 of the second metal terminal 240b, elastic deformation of the first metal terminal 240a and the second metal terminal 240b is able to absorb a mechanical strain that is generated in the ceramic layer 116 when an alternating voltage is applied.

The first mount portion 246 of the first metal terminal 240a is connected to the first extension portion 244 of the first metal terminal 240a and extends from the first extension portion 244 in a direction in which the first end surface 114e and the second end surface 114f are coupled to one another toward a side opposite to the electronic component body 112. Specifically, the first mount portion 246 bends at a terminal end of the first extension portion 244, and extends in parallel or substantially parallel to the mounting surface.

The shape of the first mount portion 246 is preferably triangular or substantially triangular in plan view. The first mount portion 246 includes a first protrusion 246a that is sufficiently pressed and deformed in a circular or substantially circular shape and protrudes toward the mounting surface of the mounting substrate. A recess on the side opposite to the mounting surface of the mounting substrate at the first protrusion 246a defines and functions as a first recess 246b.

The shape in plan view of the first mount portion 246 is not limited to the triangular or substantially triangular shape, and may be a quadrangular or substantially quadrangular shape.

The second mount portion 256 of the second metal terminal 240b is connected to the second extension portion 254 of the second metal terminal 240b and extends from the second extension portion 254 in the direction in which the first end surface 114e and the second end surface 114f are coupled to one another toward a side opposite to the electronic component body 112. Specifically, the second mount portion 256 bends at a terminal end of the second extension portion 254, and extends in parallel or substantially parallel to the mounting surface.

The shape of the second mount portion 256 is preferably triangular or substantially triangular in plan view. The second mount portion 256 includes a second protrusion 256a that is sufficiently pressed and deformed in a circular or substantially circular shape and protrudes toward the mounting surface of the mounting substrate. A recess on the side opposite to the mounting surface of the mounting substrate at the second protrusion 256a defines and functions as a second recess 256b.

The shape in plan view of the second mount portion 256 is not limited to the triangular or substantially triangular shape, and may be a quadrangular or substantially quadrangular shape.

The first protrusion 246a is preferably provided at one of end sides of the first mount portion 246 in a direction orthogonal or substantially orthogonal to a direction in which the first metal terminal 240a extends. The second protrusion 256a is preferably provided at one of end sides of the second mount portion 256 in a direction orthogonal or substantially orthogonal to a direction in which the second metal terminal 240b extends. At this time, the first protrusion 246a and the second protrusion 256a are preferably located at end portions on the same side in the direction orthogonal or substantially orthogonal to the direction in which the first metal terminal 240a and the second metal terminal 240b extend. In particular, the first protrusion 246a and the second protrusion 256a are preferably located on the side opposite to the oblique edges that define the first mount portion 246 and the second mount portion 256.

Also, the first mount portion 246 of the first metal terminal 240a, and the second mount portion 256 of the second metal terminal 240b include small contact areas with respect to the mounting substrate. Welding is able to be performed by merely irradiating, with laser beams, the first recess 246b on the side opposite to the mounting surface of the mounting substrate at the first protrusion 246a, and the second recess 256b on the side opposite to the mounting surface of the mounting substrate at the second protrusion 256a. Thus, the welding time is decreased.

The first protrusion 246a and the second protrusion 256a may be angular or rounded.

In the ceramic electronic component 210 according to the present preferred embodiment, the height h of each of the first protrusion 246a and the second protrusion 256a is preferably in a range from about 0.1 mm to about 0.5 mm, for example, from a bottom surface of the first mount portion 246 or the second mount portion 256. Alternatively, the height h of each of the first protrusion 246a and the second protrusion 256a is preferably in a range from about 1% to about 6%, for example, of the distance between the first protrusion 246a and the second protrusion 256a. Accordingly, undulations of the board surface and low coplanarity of the electronic component are absorbed, and the protrusions securely contact the board. In addition, irradiation with laser beams is reliably provided.

The first metal terminal 240a and the second metal terminal 240b each include a terminal body, and a plated film provided on a surface of the terminal body. The material and structure of the terminal body and the plated film of each of the first metal terminal 240a and the second metal terminal 240b are the same or substantially the same as those of the first metal terminal 40a and the second metal terminal 40b, and thus, the description thereof is omitted.

The plated film may not be provided on at least a peripheral surface 249 of the first extension portion 244 and the first mount portion 246 of the first metal terminal 240a, and a peripheral surface 251 of the second extension portion 254 and the second mount portion 256 of the second metal terminal 240b.

The first outer electrode 130a and the first metal terminal 240a are connected by the first outer electrode 130a provided on the surface of the second main surface 114b, and the first joint material 260a. The second outer electrode 130b and the second metal terminal 240b are connected by the second outer electrode 130b provided on the surface of the second main surface 114b, and the second joint material 260b. The material of the first joint material 260a and the second joint material 260b is the same or substantially the same as that of the first joint material 60a and the second joint material 60b, and thus, the description thereof is omitted.

A dimension L is a dimension of the ceramic electronic component 210 in the length direction z (in which the metal terminals extend), the ceramic electronic component 210 including the outer resin material 170, the first metal terminal 240a, and the second metal terminal 240b, a dimension T is a dimension of the ceramic electronic component 210 in the stack direction x of the outer resin material 170 (a direction in which the first main surface 170a and the second main surface 170b of the outer resin material 170 are coupled to one another), and a dimension W is a dimension of the ceramic electronic component 210 in the width direction y of the outer resin material 170 (a direction in which the first side surface 170c and the second side surface 170d of the outer resin material 170 are coupled to one another).

The dimensions of the ceramic electronic component 210 are not particularly limited. However, preferably the dimension L in the length direction z is in a range from about 2 mm to about 40 mm, the dimension W in the width direction y is in a range from about 1.2 mm to about 40 mm, and the dimension T in the stack direction x is in a range from about 1.2 mm to about 10 mm, for example.

Next, a mounting structure for the ceramic electronic component 210 according to the present preferred embodiment is described.

As illustrated in FIG. 17, the ceramic electronic component 210 is mounted on the mounting substrate 80.

Specifically, the ceramic electronic component 210 is disposed on the mounting surface of the mounting substrate 80, and is joined to the mounting substrate 80 by welding at the first protrusion 246a of the first mount portion 246 of the first metal terminal 240a, and the second protrusion 256a of the second mount portion 256 of the second metal terminal 240b.

The joining by welding is preferably joining by welding using laser beams L. That is, mounting by welding is performed by irradiating, with the laser beams L, the first recess 246b on the side opposite to the mounting surface of the mounting substrate 80 at the position of the first protrusion 246a, and the second recess 256b on the side opposite to the mounting surface of the mounting substrate 80 at the position of the second protrusion 256a.

With the ceramic electronic component 210 according to the present preferred embodiment, since the first protrusion 246a of the first mount portion 246, the second protrusion 256a of the second mount portion 256, and the protruding portion 172 of the outer resin material 170 are provided, the ceramic electronic component 210 contacts the mounting surface of the mounting substrate 80 at three positions, by point contact or surface contact in small areas. Accordingly, even when the mounting substrate 80 is warped, or even when the connection positions are not in one plane due to a step, the contact with the mounting substrate 80 at the three positions is securely provided, and mounting by laser welding is reliably performed.

With the mounting structure for the ceramic electronic component 210 according to the present preferred embodiment, the vertex of the first protrusion 246a of the first metal terminal 240a, the vertex of the second protrusion 256a of the second metal terminal 240b, and the vertex of the protruding portion 172 of the outer resin material 170 are in contact the mounting surface of the mounting substrate 80. The contact area is small, and mounting by welding is able to be performed by irradiating, with the laser beams L, the portions with the small areas of the first recess 246b and the second recess 256b. Thus, mounting by welding is easily performed in a short period of time.

Next, a preferred embodiment of a method of manufacturing the ceramic electronic component according to the third preferred embodiment having the above-described configuration is described, using the ceramic electronic component 210 as an example. A method of manufacturing an element body of a multilayer structure has a configuration similar to that of the ceramic electronic component 110 described with reference to FIGS. 6 to 11, and thus, the description thereof is omitted.

A step of attaching the metal terminals in the method of manufacturing the ceramic electronic component according to the present preferred embodiment is described.

First, the first metal terminal 240a and the second metal terminal 240b are prepared.

The first metal terminal 240a and the second metal terminal 240b are shaped by bending.

Then, one main surface of the first terminal joint portion 242 of the first metal terminal 240a is disposed to contact the second main surface 114b of the electronic component body 112, and one main surface of the second terminal joint portion 252 of the second metal terminal 240b is disposed to contact the second main surface 114b of the electronic component body 112. Then, the first joint material (solder) 260a is applied to the surface of the first outer electrode 130a on the first end surface 114e of the electronic component body 112 or the surface of the first terminal joint portion 242 of the first metal terminal 240a. Then, by performing reflowing in a state in which the first outer electrode 130a of the electronic component body 112 is joined to the first terminal joint portion 242 of the first metal terminal 240a, the first metal terminal 240a is attached to the first outer electrode 130a of the electronic component body 112. Similarly, the second joint material (solder) 260b is applied to the surface of the second outer electrode 130b on the second end surface 114f of the electronic component body 112 or the surface of the second terminal joint portion 252 of the prepared second metal terminal 240b. Then, by performing reflowing in a state in which the second outer electrode 130b of the electronic component body 112 is joined to the second terminal joint portion 252 of the second metal terminal 240b, the second metal terminal 240b is attached to the second outer electrode 130b of the electronic component body 112.

Then, the outer resin material 170 is formed. The outer resin material 170 is preferably formed, for example, by applying liquid or powder silicone-based or epoxy-based resin by dip coating to the electronic component body 112 to which the metal terminals are attached, and hardening resin. The hardening temperature is preferably in a range from about 150° C. to about 200° C., for example, depending on the material of epoxy resin. The outer resin material 170 may be molded by a method of injection molding engineering plastics or a method of transfer molding engineering plastics, for example. In particular, the outer resin material 170 is preferably made of thermosetting epoxy resin.

Then, after the outer resin material 170 is formed, the metal terminals protruding from the outer resin material 170 are bent along the side surfaces and bottom surface of the outer resin material 170, and the ceramic electronic component 210 illustrated in FIG. 12 is obtained.

The present invention is not limited to the above-described preferred embodiments, and may be modified within the scope of the invention. The thickness of each ceramic layer, the number of ceramic layers, the area of counter electrode, and the external dimension of the electronic component body are not limited to the exemplified values.

While the ceramic electronic components 110 and 210 according to the preferred embodiments each include only one electronic component body 112, it is not limited thereto. Two or more electronic component bodies 112 may be stacked.

While preferred embodiments of the present invention have been described above, it is to be understood that variations and modifications will be apparent to those skilled in the art without departing from the scope and spirit of the present invention. The scope of the invention, therefore, is to be determined solely by the following claims.

What is claimed is:

1. A ceramic electronic component comprising:
   an element body including a first main surface and a second main surface that are opposed to one another;
   an electronic component body including a first outer electrode provided on the element body, and a second outer electrode provided on the element body;
   a first metal terminal connected to the first outer electrode;
   a second metal terminal connected to the second outer electrode; and
   an outer resin material that covers the electronic component body, the first and second outer electrodes, a portion of the first metal terminal, and a portion of the second metal terminal; wherein
   the second main surface of the element body is located on a side near a mounting surface of a mounting substrate on which the ceramic electronic component is to be mounted;
   the first metal terminal includes:
      a first terminal joint portion that is connected to the first outer electrode;
      a first extension portion that is connected to the first terminal joint portion and that defines a gap between the second main surface of the electronic component body and the mounting surface of the mounting substrate; and
      a first mount portion that is connected to the first extension portion and that extends toward a side opposite to the electronic component body;
   the second metal terminal includes:
      a second terminal joint portion that is connected to the second outer electrode;
      a second extension portion that is connected to the second terminal joint portion and that defines a gap between the second main surface of the electronic component body and the mounting surface of the mounting substrate; and
      a second mount portion that is connected to the second extension portion and that extends toward a side opposite to the electronic component body;
   the outer resin material includes a protruding portion that protrudes toward the mounting surface of the mounting substrate;
   the first mount portion includes a first protrusion that protrudes toward the mounting surface of the mounting substrate;
   the second mount portion includes a second protrusion that protrudes toward the mounting surface of the mounting substrate;
   vertices of the first protrusion, the second protrusion, and the protruding portion are in contact with the mounting surface; and
   the protruding portion, the first protrusion, and the second protrusion are not disposed in a straight line.

2. The ceramic electronic component according to claim 1, wherein a height of each of the first protrusion and the second protrusion from a side near the mounting surface of the first mount portion is in a range from about 0.1 mm to about 0.5 mm.

3. The ceramic electronic component according to claim 1, wherein a height of each of the first protrusion and the second protrusion from a side near the mounting surface of the first mount portion is in a range from about 1% to about 6% of a distance between the first protrusion and the second protrusion.

4. The ceramic electronic component according claim 1, wherein a surface of each of the first metal terminal and the second metal terminal is a black color or is oxidized.

5. The ceramic electronic component according claim 1, wherein the outer resin material is made of thermosetting epoxy resin.

6. The ceramic electronic component according claim 1, wherein each of the first and second protrusions has a circular or substantially circular shape.

7. The ceramic electronic component according claim 1, wherein each of the first and second mount portions has a triangular or substantially triangular shape in plan view.

8. The ceramic electronic component according claim 1, wherein each of the first and second metal terminals include a terminal body and a plated film provided on the terminal body.

9. A mounting structure for a ceramic electronic component, wherein
   the ceramic electronic component includes:
      an element body including a first main surface and a second main surface that are opposed to one another;
      an electronic component body including a first outer electrode provided on the element body, and a second outer electrode provided on the element body;
      a first metal terminal connected to the first outer electrode;
      a second metal terminal connected to the second outer electrode; and
      an outer resin material that covers the electronic component body, the first and second outer electrodes, a portion of the first metal terminal, and a portion of the second metal terminal; wherein the second main surface of the element body is located on a side near a mounting surface of a mounting substrate on which the ceramic electronic component is to be mounted;

the first metal terminal includes:
- a first terminal joint portion that is connected to the first outer electrode;
- a first extension portion that is connected to the first terminal joint portion and that defines a gap between the second main surface of the electronic component body and the mounting surface of the mounting substrate; and
- a first mount portion that is connected to the first extension portion and that extends toward a side opposite to the electronic component body;

the second metal terminal includes:
- a second terminal joint portion that is connected to the second outer electrode;
- a second extension portion that is connected to the second terminal joint portion and that defines a gap between the second main surface of the electronic component body and the mounting surface of the mounting substrate; and
- a second mount portion that is connected to the second extension portion and that extends toward a side opposite to the electronic component body;

the outer resin material includes a protruding portion;

the first mount portion includes a first protrusion that protrudes toward the mounting surface;

the second mount portion includes a second protrusion that protrudes toward the mounting surface;

vertices of the first protrusion, the second protrusion, and the protruding portion are joined to the mounting surface of the mounting substrate;

the joining is performed by welding to the mounting surface of the mounting substrate from a first recess on a side opposite to the mounting surface of the mounting substrate at a position of the first protrusion; and the joining is performed by welding to the mounting surface of the mounting substrate from a second recess on a side opposite to the mounting surface of the mounting substrate at a position of the second protrusion.

10. The mounting structure for the ceramic electronic component according to claim 9, wherein the joining by welding is joining by laser welding that is performed by irradiating the first recess and the second recess with laser beams.

11. The mounting structure for the ceramic electronic component according to claim 9, wherein a height of each of the first protrusion and the second protrusion from a side near the mounting surface of the first mount portion is in a range from about 0.1 mm to about 0.5 mm.

12. The mounting structure for the ceramic electronic component according to claim 9, wherein a height of each of the first protrusion and the second protrusion from a side near the mounting surface of the first mount portion is in a range from about 1% to about 6% of a distance between the first protrusion and the second protrusion.

13. The mounting structure for the ceramic electronic component according to claim 9, wherein a surface of each of the first metal terminal and the second metal terminal is a black color or is oxidized.

14. The mounting structure for the ceramic electronic component according to claim 9, wherein the protruding portion, the first protrusion, and the second protrusion are not disposed in a straight line.

15. The mounting structure for the ceramic electronic component according to claim 9, wherein the outer resin material is made of thermosetting epoxy resin.

16. The mounting structure for the ceramic electronic component according to claim 9, wherein each of the first and second protrusions has a circular or substantially circular shape.

17. The mounting structure for the ceramic electronic component according to claim 9, wherein each of the first and second mount portions has a triangular or substantially triangular shape in plan view.

18. The mounting structure for the ceramic electronic component according to claim 9, wherein each of the first and second metal terminals include a terminal body and a plated film provided on the terminal body.

* * * * *